United States Patent
Shimizu

(10) Patent No.: US 11,502,173 B2
(45) Date of Patent: Nov. 15, 2022

(54) SEMICONDUCTOR DEVICE, INVERTER CIRCUIT, DRIVE, VEHICLE, AND ELEVATOR

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/182,480

(22) Filed: Feb. 23, 2021

(65) Prior Publication Data

US 2022/0045175 A1 Feb. 10, 2022

(30) Foreign Application Priority Data

Aug. 6, 2020 (JP) .............................. JP2020-134196

(51) Int. Cl.
*H01L 29/16* (2006.01)
*H01L 29/66* (2006.01)
*H01L 29/78* (2006.01)

(52) U.S. Cl.
CPC .... *H01L 29/1608* (2013.01); *H01L 29/66666* (2013.01); *H01L 29/7827* (2013.01)

(58) Field of Classification Search
CPC .......... H01L 29/1608; H01L 29/66666; H01L 29/7827; H01L 29/41766; H01L 29/167; H01L 29/45; H01L 29/66068; H01L 29/7806; H01L 29/7813; H01L 29/7802
See application file for complete search history.

(56) References Cited

U.S. PATENT DOCUMENTS

| 9,893,153 B2 | 2/2018 | Shimizu |
| 2018/0277643 A1 | 9/2018 | Shimizu et al. |
| 2021/0066467 A1 | 3/2021 | Shimizu et al. |
| 2021/0296128 A1* | 9/2021 | Shimizu ............ H01L 21/02337 |
| 2021/0359098 A1* | 11/2021 | Shimizu .............. H01L 29/1608 |
| 2022/0085169 A1* | 3/2022 | Shimizu ................ H01L 21/046 |
| 2022/0085170 A1* | 3/2022 | Shimizu .............. H01L 29/0856 |

FOREIGN PATENT DOCUMENTS

| JP | 2011-82454 A | 4/2011 |
| JP | 2016-63111 A | 4/2016 |
| JP | 6692265 B2 | 5/2020 |
| JP | 2021-34627 A | 3/2021 |
| WO | WO 2019/171678 A1 | 9/2019 |

OTHER PUBLICATIONS

Noguchi, M. et al., "Improvement in the Channel Performance and NBTI of SiC-MOSFETs by Oxygen Doping," IEDM19, 2019, 4 pages.
Noguchi, M. et al., "Channel engineering of 4H-SiC MOSFETs using sulphur as a deep level donor," IEDM18, 2018, 4 pages.

* cited by examiner

*Primary Examiner* — Mohammad M Hoque
(74) *Attorney, Agent, or Firm* — Oblon, McClelland, Maier & Neustadt, L.L.P.

(57) ABSTRACT

A semiconductor device according to embodiments includes a gate electrode; a gate insulating layer; and a silicon carbide layer having a first plane and a second plane facing the first plane, the silicon carbide layer including a first silicon carbide region of p-type and a second silicon carbide region positioned between the first silicon carbide region and the gate insulating layer, and the second silicon carbide region including at least one oxygen atom bonded to four silicon atoms.

20 Claims, 28 Drawing Sheets

SEMICONDUCTOR DEVICE, INVERTER CIRCUIT, DRIVE, VEHICLE, AND ELEVATOR

CROSS-REFERENCE TO RELATED APPLICATION

This application is based upon and claims the benefit of priority from Japanese Patent Application No. 2020-134196, filed on Aug. 6, 2020, the entire contents of which are incorporated herein by reference.

FIELD

Embodiments described herein relate generally to a semiconductor device, an inverter circuit, a drive, a vehicle, and an elevator.

BACKGROUND

Silicon carbide (SiC) is expected as a material of next-generation semiconductor devices. Compared with silicon (Si), silicon carbide has excellent physical properties such as a band gap of about three times, breakdown field strength of about 10 times, and thermal conductivity of about three times. By utilizing these characteristics, a semiconductor device that achieves low loss and high temperature operation can be implemented.

With a metal oxide semiconductor field effect transistor (MOSFET) using silicon carbide, for example, threshold voltage and mobility tend to be low as compared with a MOSFET using silicon. Therefore, a MOSFET that can achieve high threshold voltage and high mobility is desired.

DETAILED DESCRIPTION

Figure 1:
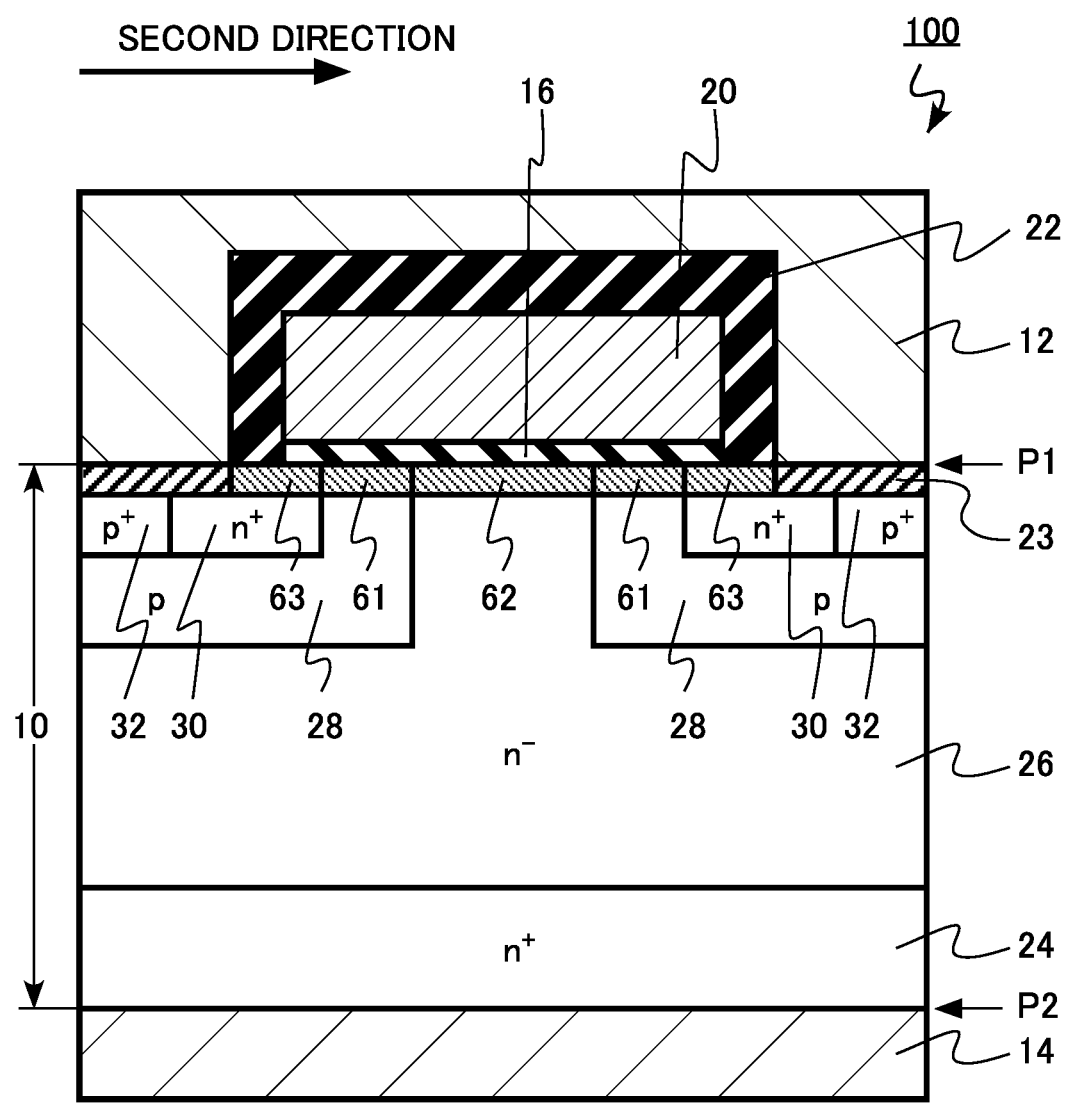
FIG. 1 is a schematic cross-sectional view of a semiconductor device according to a first embodiment.

A semiconductor device according to embodiments of the present disclosure includes a gate electrode; a gate insulating layer; and a silicon carbide layer having a first plane and a second plane facing the first plane, the silicon carbide layer including a first silicon carbide region of p-type and a second silicon carbide region positioned between the first silicon carbide region and the gate insulating layer, and the second silicon carbide region including at least one oxygen atom bonded to four silicon atoms.

Hereinafter, embodiments of the present disclosure will be described with reference to the drawings. In the following description, the same or similar members will be denoted by the same reference signs, and description of a member described once will be appropriately omitted.

Further, $n^+$, $n$, $n^-$, $p^+$, $p$, or $p^-$ in the following description represents a relative degree of impurity concentration in each of the conductivity types. That is, $n^+$ indicates that n-type impurity concentration is relatively high as compared to $n$, and $n^-$ indicates that n-type impurity concentration is relatively low as compared to $n$. Further, $p^+$ indicates that p-type impurity concentration is relatively high as compared to p, and p⁻ indicates that p-type impurity concentration is relatively low as compared to p. Note that n⁺-type and n⁻-type may be simply described as n-type, and p⁺-type and p⁻-type may be simply described as p-type. Unless otherwise specified, impurity concentration in each of regions is represented by, for example, a value of impurity concentration in a central portion of each of the regions.

Impurity concentration can be measured with, for example, Secondary Ion Mass Spectrometry (SIMS). A relative degree of impurity concentration can be determined on the basis of, for example, a degree of carrier concentration obtained with Scanning Capacitance Microscopy (SCM). A distance of width, depth, or the like of an impurity region can be obtained with, for example, SIMS. Further, a distance of width, depth, or the like of an impurity region can be obtained on the basis of, for example, an SCM image.

Depth of a trench, thickness of an insulating layer, or the like can be measured, for example, on an image of SIMS or Transmission Electron Microscope (TEM).

A bonding state of an oxygen atom in a silicon carbide layer can be identified by using X-ray photoelectron spectroscopy (XPS), infrared spectroscopy, or Raman spectroscopy. Whether or not an oxygen atom in a silicon carbide layer sits at a carbon site of a crystal structure of silicon carbide can be determined by using, for example, X-ray photoelectron spectroscopy, infrared spectroscopy, or Raman spectroscopy. Whether or not an oxygen atom in a silicon carbide layer sits at a silicon site of a crystal structure of silicon carbide can be determined by using, for example, X-ray photoelectron spectroscopy, infrared spectroscopy, or Raman spectroscopy.

First Embodiment

A semiconductor device according to a first embodiment includes a gate electrode; a gate insulating layer; and a silicon carbide layer having a first plane and a second plane facing the first plane, the silicon carbide layer including a first silicon carbide region of p-type and a second silicon carbide region positioned between the first silicon carbide region and the gate insulating layer, and the second silicon carbide region including at least one oxygen atom bonded to four silicon atoms. The silicon carbide layer further includes a third silicon carbide region of n-type positioned between the second plane and the first silicon carbide region, a fourth silicon carbide region of n-type positioned between the first silicon carbide region and the first plane and having n-type impurity concentration higher than n-type impurity concentration in the third silicon carbide region, and a fifth silicon carbide region positioned between the third silicon carbide region and the gate insulating layer, and the fifth silicon carbide region including at least one oxygen atom bonded to four silicon atoms. The silicon carbide layer further includes a sixth silicon carbide region positioned between the fourth silicon carbide region and the gate insulating layer, and the sixth silicon carbide region including at least one oxygen atom bonded to four silicon atoms.

FIG. 1 is a schematic cross-sectional view of the semiconductor device according to the first embodiment. The semiconductor device according to the first embodiment is a MOSFET 100 of vertical and planar-gate-type. The MOSFET 100 is an n-channel transistor that uses an electron as a carrier.

Figure 2:
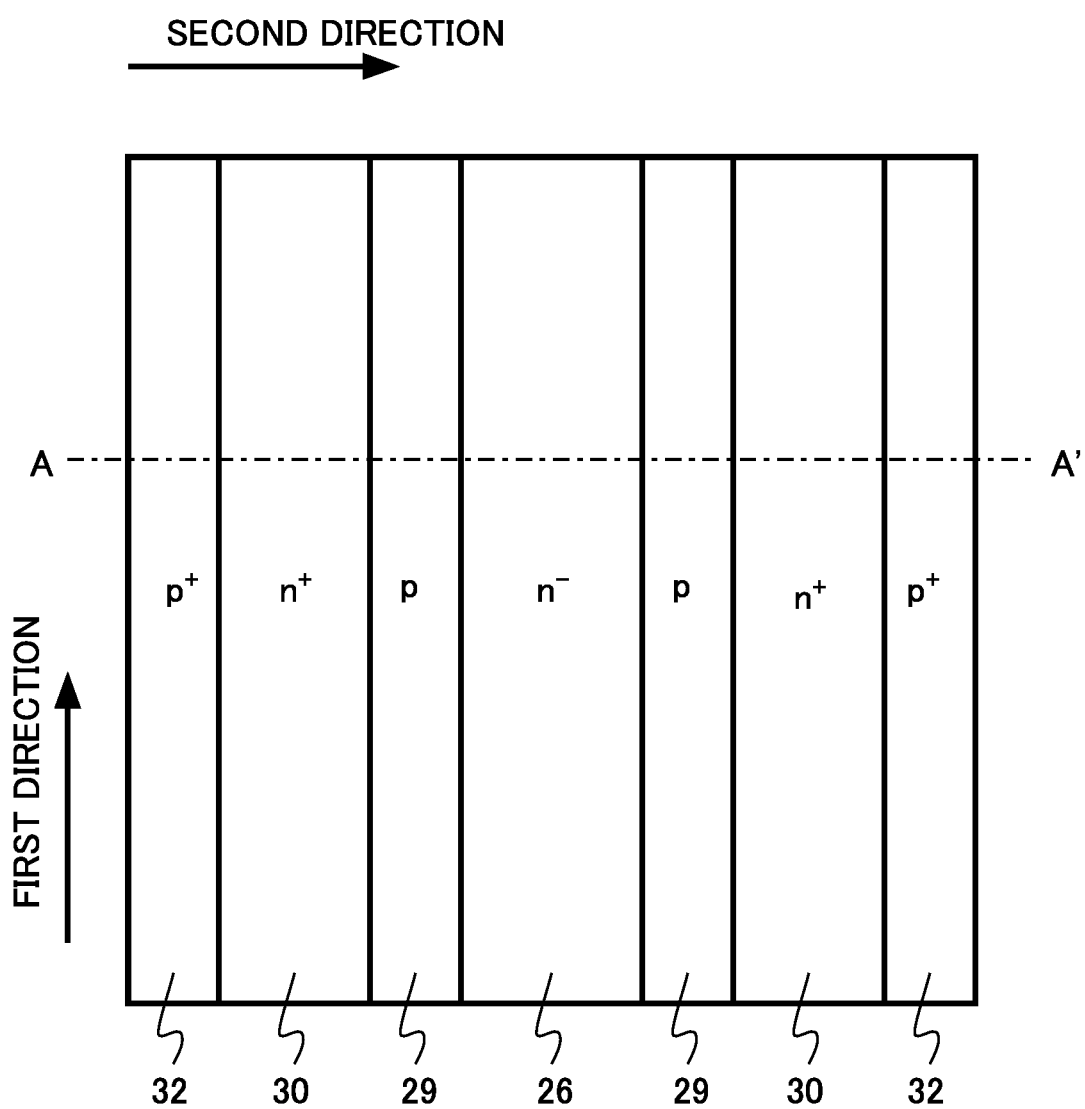
FIG. 2 is a schematic top view of the semiconductor device according to the first embodiment.

FIG. 2 is a schematic top view of the semiconductor device according to the first embodiment. FIG. 2 is a diagram illustrating a side of a first plane of a silicon carbide layer 10. FIG. 2 illustrates a cross section passing through a drift region 26, p-well region 28, source region 30, and p-well contact region 32 of the silicon carbide layer 10. FIG. 1 illustrates a cross section taken along AA' in FIG. 2.

The MOSFET 100 includes the silicon carbide layer 10, a source electrode 12 (first electrode), a drain electrode 14 (second electrode), a gate insulating layer 16, a gate electrode 20, an interlayer insulating layer 22, and a metal silicide layer 23.

In the silicon carbide layer 10, there are a drain region 24, the drift region 26 (third silicon carbide region), the p-well region 28 (first silicon carbide region), the source region 30 (fourth silicon carbide region), the p-well contact region 32, a first oxygen region 61 (second silicon carbide region), a second oxygen region 62 (fifth silicon carbide region), a third oxygen region 63 (sixth silicon carbide region).

Figure 3:
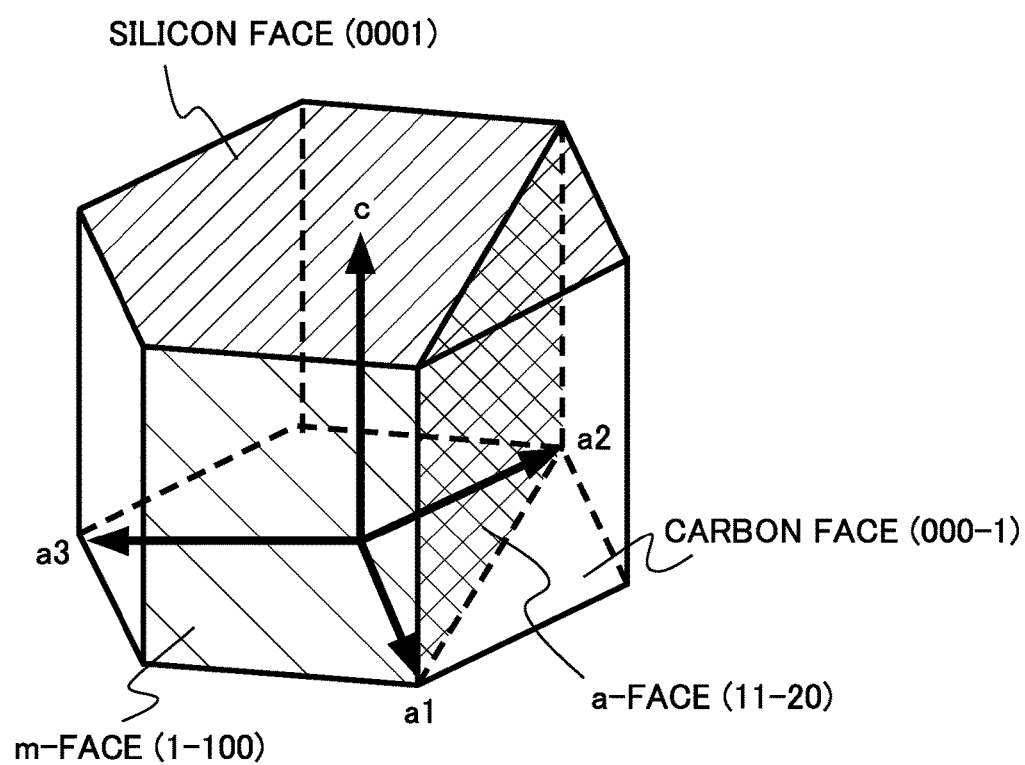
FIG. 3 is a diagram illustrating a crystal structure of a SiC semiconductor.

FIG. 3 is a diagram illustrating a crystal structure of a SiC semiconductor. A typical crystal structure of a SiC semiconductor is a hexagonal crystal system such as 4H—SiC.

In a SiC semiconductor having a hexagonal crystal system, one of faces of a hexagonal column, which has a c-axis along an axial direction as a normal line (a top face of the hexagonal column), is a (0001) face. The (0001) face is referred to as a silicon face. Silicon atoms (Si) are arranged on an outermost surface of the silicon face.

Another of the faces of the hexagonal column, which has a c-axis along the axial direction as a normal line (a top face of the hexagonal column), is a (000-1) face. The (000-1) face is referred to as a carbon face. Carbon atoms (C) are arranged on an outermost surface of the carbon face.

A side face (pillar face) of the hexagonal column is an m-face, which is a face equivalent to a (1-100) face, that is, a {1-100} face. A face passing through a pair of non-adjacent ridgelines is an a-face, which is a face equivalent to a (11-20) face, that is, a face {11-20}. Both silicon atoms (Si) and carbon atoms (C) are arranged on outermost surfaces of the m-face and a-face.

The silicon carbide layer 10 is, for example, a single crystal of 4H—SiC. The silicon carbide layer 10 has a first plane P1 and a second plane P2. The second plane P2 faces the first plane P1. The first plane P1 is a front surface of the silicon carbide layer 10, and the second plane P2 is a back surface of the silicon carbide layer 10.

As used herein, the term "depth" means a depth relative to the first plane.

Hereinafter, description will be given taking a case where, as an example, the first plane P1 of the silicon carbide layer 10 is a plane having a tilt of 0 degrees or more and 10 degrees or less with respect to the silicon face, and the second plane P2 is a plane having a tilt of 0 degrees or more and 10 degrees or less with respect to the carbon face. The first plane P1 of the silicon carbide layer 10 has an off-angle of 0 degrees or more to 10 degrees or less with respect to the silicon face.

A characteristic of a plane having a tilt of 0 degrees or more to 10 degrees or less with respect to the silicon face can be regarded as substantially equal to a characteristic of the silicon face. A characteristic of a plane having a tilt of 0 degrees or more to 10 degrees or less with respect to the carbon face can be regarded as substantially equal to a characteristic of the carbon face.

The drain region 24 is SiC of n⁺-type. The drain region 24 includes, for example, nitrogen (N) as an n-type impurity. N-type impurity concentration in the drain region 24 is, for example, $1 \times 10^{18}$ cm⁻³ or more and $1 \times 10^{21}$ cm⁻³ or less.

The drift region 26 is SiC of n⁻-type. The drift region 26 is positioned between the drain region 24 and the first plane P1. A portion of the drift region 26 is in contact with the first plane P1.

The drift region 26 includes, for example, nitrogen (N) as an n-type impurity. The n-type impurity concentration in the drift region 26 is, for example, $1 \times 10^{15}$ cm$^{-3}$ or more and $2 \times 10^{16}$ cm$^{-3}$ or less. The n-type impurity concentration in the drift region 26 is lower than the n-type impurity concentration in the drain region 24.

The drift region 26 is, for example, an epitaxial growth layer of SiC formed on the drain region 24 by epitaxial growth. Thickness of the drift region 26 is, for example, 5 µm or more and 100 µm or less.

The p-well region 28 is SiC of p-type. The p-well region 28 is positioned between the drift region 26 and the first plane P1. The p-well region 28 extends in a first direction.

The p-well region 28 includes, for example, aluminum (Al) as a p-type impurity. The p-type impurity concentration in the p-well region 28 is, for example, $1 \times 10^{16}$ cm$^{-3}$ or more and $1 \times 10^{20}$ cm$^{-3}$ or less. Maximum p-type impurity concentration in the p-well region 28 is, for example, $1 \times 10^{16}$ cm$^{-3}$ or more and $1 \times 10^{20}$ cm$^{-3}$ or less.

Depth of the p-well region 28 is, for example, 0.4 µm or more and 0.8 µm or less. The p-well region 28 functions as a channel region of the MOSFET 100.

The source region 30 is SiC of n⁺-type. The source region 30 is positioned between the p-well region 28 and the first plane P1. A portion of the source region 30 is in contact with the first plane P1. The source region 30 extends in the first direction.

The source region 30 includes, for example, phosphorus (P) as an n-type impurity. The n-type impurity concentration in the source region 30 is, for example, $1 \times 10^{18}$ cm$^{-3}$ or more and $1 \times 10^{22}$ cm$^{-3}$ or less. The n-type impurity concentration in the source region 30 is higher than the n-type impurity concentration in the drift region 26.

Depth of the source region 30 is less than the depth of the p-well region 28. The depth of the source region 30 is, for example, 0.2 µm or more and 0.4 µm or less.

The p-well contact region 32 is SiC of p⁺-type. The p-well contact region 32 is positioned between the p-well region 28 and the first plane P1. A portion of the p-well contact region 32 is in contact with the first plane P1. The p-well contact region 32 is adjacent to the source region 30. The p-well contact region 32 extends in the first direction.

The p-well contact region 32 includes, for example, aluminum as a p-type impurity. The p-type impurity concentration in the p-well contact region 32 is, for example, $1 \times 10^{18}$ cm$^{-3}$ or more and $1 \times 10^{22}$ cm$^{-3}$ or less. The p-type impurity concentration in the p-well contact region 32 is higher than the p-type impurity concentration in the p-well region 28.

Depth of the p-well contact region 32 is less than the depth of the p-well region 28. The depth of the p-well contact region 32 is, for example, 0.2 µm or more and 0.4 µm or less.

The first oxygen region 61 is SiC of p-type. The first oxygen region 61 is positioned between the p-well region 28 and the first plane P1. A portion of the first oxygen region 61 is in contact with the first plane P1.

The first oxygen region 61 is provided between the p-well region 28 and the gate electrode 20. The first oxygen region 61 is provided between the p-well region 28 and the gate insulating layer 16. A portion of the first oxygen region 61 is in contact with the gate insulating layer 16.

The first oxygen region 61 includes, for example, aluminum (Al) as a p-type impurity. The p-type impurity concentration in the first oxygen region 61 is, for example, $1 \times 10^{15}$ cm$^{-3}$ or more and $1 \times 10^{20}$ cm$^{-3}$ or less. Maximum p-type impurity concentration in the first oxygen region 61 is, for example, $1 \times 10^{15}$ cm$^{-3}$ or more and $1 \times 10^{20}$ cm$^{-3}$ or less.

The first oxygen region 61 includes oxygen. Oxygen concentration in the first oxygen region 61 is, for example, $1 \times 10^{17}$ cm$^{-3}$ or more and $1 \times 10^{23}$ cm$^{-3}$ or less. Maximum oxygen concentration in the first oxygen region 61 is, for example, $1 \times 10^{17}$ cm$^{-3}$ or more and $1 \times 10^{23}$ cm$^{-3}$ or less.

The oxygen concentration in the first oxygen region 61 is higher than oxygen concentration in the p-well region 28, for example. The oxygen concentration in the first oxygen region 61 is higher than maximum oxygen concentration in the p-well region 28, for example.

The oxygen concentration in the first oxygen region 61 is higher than aluminum concentration in the first oxygen region 61, for example. The maximum oxygen concentration in the first oxygen region 61 is higher than maximum aluminum concentration in the first oxygen region 61, for example.

The second oxygen region 62 is SiC of n⁻-type. The second oxygen region 62 is positioned between the drift region 26 and the first plane P1. A portion of the second oxygen region 62 is in contact with the first plane P1.

The second oxygen region 62 is provided between the drift region 26 and the gate electrode 20. The second oxygen region 62 is provided between the drift region 26 and the gate insulating layer 16. A portion of the second oxygen region 62 is in contact with the gate insulating layer 16. The second oxygen region 62 is interposed between two p-well regions 28.

The second oxygen region 62 includes, for example, nitrogen (N) as an n-type impurity. The n-type impurity concentration in the second oxygen region 62 is, for example, $1 \times 10^{15}$ cm$^{-3}$ or more and $2 \times 10^{16}$ cm$^{-3}$ or less.

The second oxygen region 62 includes oxygen. Oxygen concentration in the second oxygen region 62 is, for example, $1 \times 10^{17}$ cm$^{-3}$ or more and $1 \times 10^{23}$ cm$^{-3}$ or less. Maximum oxygen concentration in the second oxygen region 62 is, for example, $1 \times 10^{17}$ cm$^{-3}$ or more and $1 \times 10^{23}$ cm$^{-3}$ or less.

The oxygen concentration in the second oxygen region 62 is higher than oxygen concentration in the drift region 26, for example. The oxygen concentration in the second oxygen region 62 is higher than maximum oxygen concentration in the drift region 26, for example.

The oxygen concentration in the second oxygen region 62 is higher than nitrogen concentration in the drift region 26, for example. The maximum oxygen concentration in the second oxygen region 62 is higher than maximum nitrogen concentration in the second oxygen region 62, for example.

The third oxygen region 63 is SiC of n⁺-type. The third oxygen region 63 is positioned between the source region 30 and the first plane P1. A portion of the third oxygen region 63 is in contact with the first plane P1.

The third oxygen region 63 is provided between the source region 30 and the gate electrode 20. The third oxygen region 63 is provided between the source region 30 and the gate insulating layer 16. A portion of the third oxygen region 63 is in contact with the gate insulating layer 16.

The third oxygen region 63 includes, for example, phosphorus (P) as an n-type impurity. The n-type impurity concentration in the third oxygen region 63 is, for example, $1 \times 10^{18}$ cm$^{-3}$ or more and $1 \times 10^{22}$ cm$^{-3}$ or less.

The third oxygen region 63 includes oxygen. Oxygen concentration in the third oxygen region 63 is, for example, $1\times10^{17}$ cm$^{-3}$ or more and $1\times10^{23}$ cm$^{-3}$ or less. Maximum oxygen concentration in the third oxygen region 63 is, for example, $1\times10^{17}$ cm$^{-3}$ or more and $1\times10^{23}$ cm$^{-3}$ or less.

The oxygen concentration in the third oxygen region 63 is higher than oxygen concentration in the source region 30, for example. The oxygen concentration in the third oxygen region 63 is higher than maximum oxygen concentration in the source region 30, for example.

The oxygen concentration in the third oxygen region 63 is higher than phosphorus concentration in the source region 30, for example. The maximum oxygen concentration in the third oxygen region 63 is higher than maximum phosphorus concentration in the third oxygen region 63, for example.

Figure 4:
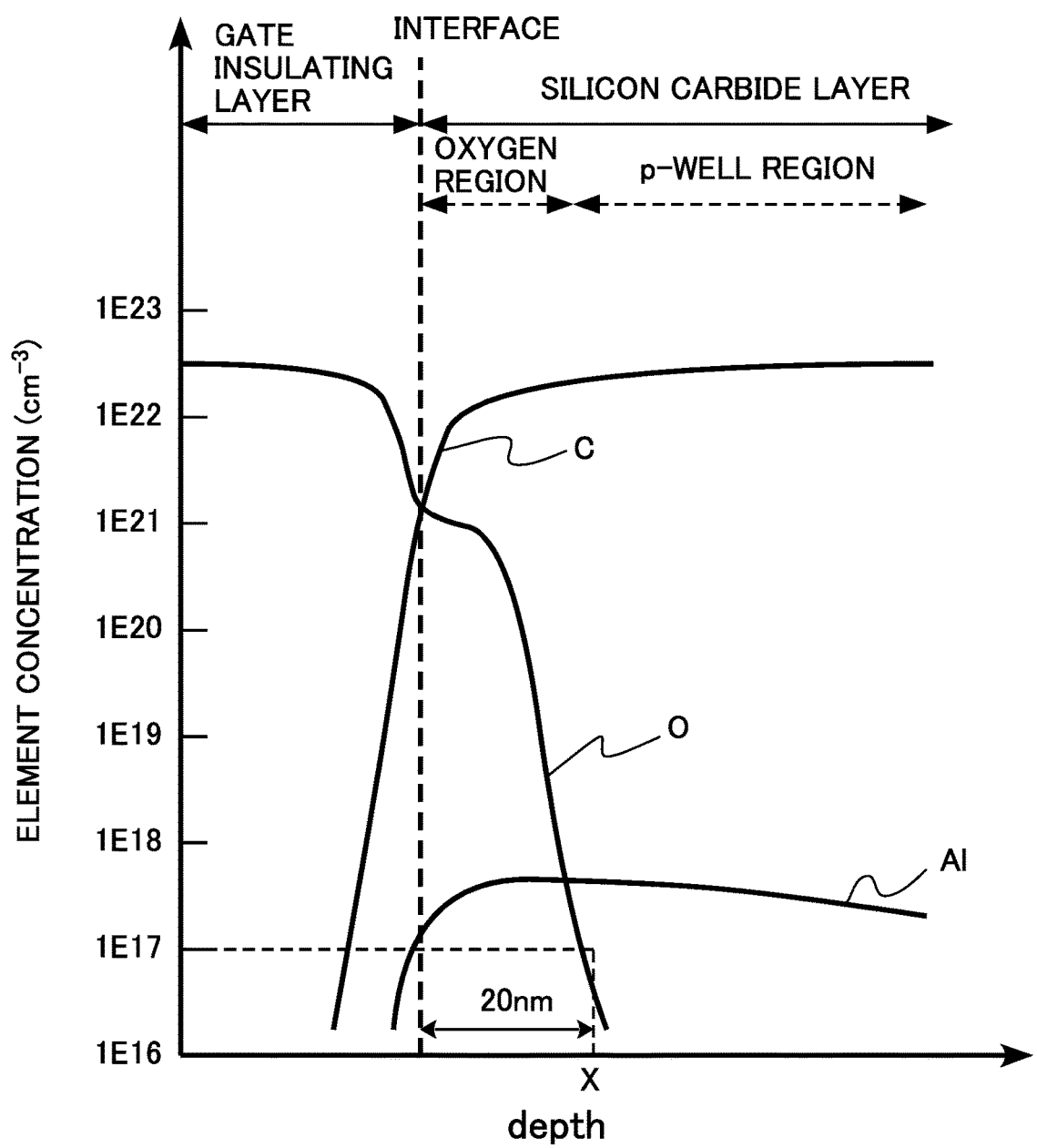
FIG. 4 is a diagram illustrating element concentration distribution of the semiconductor device according to the first embodiment.

FIG. 4 is a diagram illustrating element concentration distribution of the semiconductor device according to the first embodiment. FIG. 4 illustrates concentration distribution of oxygen (O), carbon (C), and aluminum (Al) in a depth direction. FIG. 4 illustrates concentration distribution of the elements in a portion including the gate insulating layer 16, the first oxygen region 61, and the p-well region 28.

A position 20 nm away toward the silicon carbide layer 10 from an interface between the gate insulating layer 16 and the silicon carbide layer 10 (X in FIG. 4) is defined as a first position. Oxygen concentration at the first position X is, for example, less than $1\times10^{17}$ cm$^{-3}$.

The position of the interface between the gate insulating layer 16 and the silicon carbide layer 10 is identified by, for example, measuring concentration distribution of elements with SIMS, and determining, as a position of the interface, a position where oxygen concentration that decreases from the gate insulating layer 16 toward the silicon carbide layer 10 and carbon concentration that decreases from the silicon carbide layer 10 toward the gate insulating layer 16 coincide with each other.

The first oxygen region 61 includes at least one oxygen atom bonded to four silicon atoms. The first oxygen region 61 includes oxygen atoms each bonded to four silicon atoms.

Figure 5A:
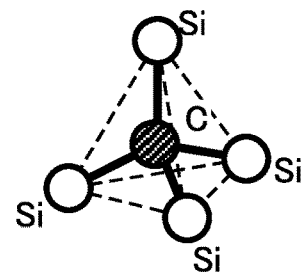
FIGS. 5A, 5B, 5C, and 5D are explanatory diagrams of a first oxygen region according to the first embodiment.
Figure 5B:
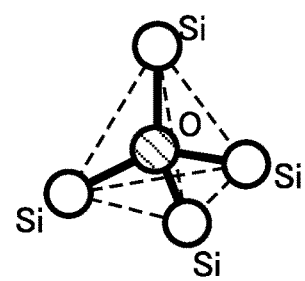
Figure 5C:
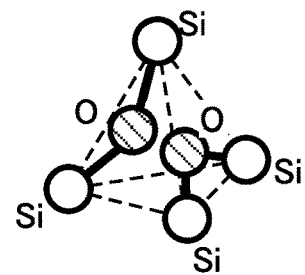
Figure 5D:
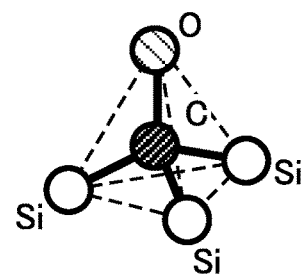

FIGS. 5A, 5B, 5C, and 5D are explanatory diagrams of a first oxygen region according to the first embodiment. FIG. 5A is a diagram illustrating a crystal structure of silicon carbide. FIG. 5B is a diagram illustrating a structure in the first oxygen region 61. FIG. 5C illustrates a structure including an oxygen atom, which is different from FIG. 5B. FIG. 5D illustrates a structure including an oxygen atom, which is different from FIGS. 5B and 5C.

In the structure illustrated in FIG. 5B, there is one oxygen atom bonded to four silicon atoms. In other words, in the structure illustrated in FIG. 5B, there is one oxygen atom positioned in a carbon site of the crystal structure of the silicon carbide illustrated in FIG. 5A. In other words, the structure illustrated in FIG. 5B has a structure in which one oxygen atom substitutes for a carbon atom of a crystal structure of silicon carbide. The structure illustrated in FIG. 5B is referred to as a first structure.

In the structure illustrated in FIG. 5C, there are oxygen atoms bonded to two silicon atoms. In other words, in the structure illustrated in FIG. 5C, there are two oxygen atoms positioned in the carbon site of the crystal structure of the silicon carbide illustrated in FIG. 5A. In other words, the structure illustrated in FIG. 5C has a structure in which two oxygen atoms substitute for a carbon atom of a crystal structure of silicon carbide. The structure illustrated in FIG. 5C is referred to as a second structure.

In the structure illustrated in FIG. 5D, there is an oxygen atom bonded to a carbon atom. In other words, in the structure illustrated in FIG. 5D, there is one oxygen atom positioned in the silicon site of the crystal structure of the silicon carbide illustrated in FIG. 5A. In other words, the structure illustrated in FIG. 5D has a structure in which one oxygen atom substitutes for a silicon atom of a crystal structure of silicon carbide. The structure illustrated in FIG. 5D is referred to as a third structure.

Density of the oxygen atom bonded to four silicon atoms in the first oxygen region 61 is higher than density of the oxygen atom bonded to two silicon atoms in the first oxygen region 61, for example. In other words, density of the first structure of the first oxygen region 61 is higher than density of the second structure of the first oxygen region 61, for example.

Density of the oxygen atom bonded to four silicon atoms in the first oxygen region 61 is higher than density of the oxygen atom bonded to a carbon atom in the first oxygen region 61, for example. In other words, density of the first structure of the first oxygen region 61 is higher than density of the third structure of the first oxygen region 61, for example.

Note that, in a case where the gate insulating layer 16 includes silicon oxide, an oxygen atom in the silicon oxide is bonded to two silicon atoms.

As similar to the first oxygen region 61, the second oxygen region 62 includes at least one oxygen atom bonded to four silicon atoms. The second oxygen region 62 includes the first structure in which one oxygen atom substitutes for a carbon atom of a crystal structure of silicon carbide.

Density of the oxygen atom bonded to four silicon atoms in the second oxygen region 62 is higher than density of the oxygen atom bonded to two silicon atoms in the second oxygen region 62, for example. In other words, density of the first structure of the second oxygen region 62 is higher than density of the second structure of the second oxygen region 62, for example.

Density of the oxygen atom bonded to four silicon atoms in the second oxygen region 62 is higher than density of the oxygen atom bonded to a carbon atom in the second oxygen region 62, for example. In other words, density of the first structure of the second oxygen region 62 is higher than density of the third structure of the second oxygen region 62, for example.

As similar to the first oxygen region 61 and the second oxygen region 62, the third oxygen region 63 includes at least one oxygen atom bonded to four silicon atoms. The third oxygen region 63 includes the first structure in which one oxygen atom substitutes for a carbon atom of a crystal structure of silicon carbide.

Density of the oxygen atom bonded to four silicon atoms in the third oxygen region 63 is higher than density of the oxygen atom bonded to two silicon atoms in the third oxygen region 63, for example. In other words, density of the first structure of the third oxygen region 63 is higher than density of the second structure of the third oxygen region 63, for example.

Density of the oxygen atom bonded to four silicon atoms in the third oxygen region 63 is higher than density of the oxygen atom bonded to a carbon atom in the third oxygen region 63, for example. In other words, density of the first structure of the third oxygen region 63 is higher than density of the third structure of the third oxygen region 63, for example.

Relative difference in densities of the first structure, second structure, and third structure in the first oxygen region 61, second oxygen region 62, and third oxygen region 63 can be determined by using, for example, X-ray photoelectron spectroscopy, infrared spectroscopy, or Raman spectroscopy.

The gate insulating layer 16 is positioned between the silicon carbide layer 10 and the gate electrode 20. The gate insulating layer 16 is positioned between the p-well region 28 and the gate electrode 20.

The gate insulating layer 16 is, for example, an oxide or an oxynitride. The gate insulating layer 16 is, for example, silicon oxide. Thickness of the gate insulating layer 16 is, for example, 30 nm or more and 200 nm or less.

The gate insulating layer 16 and the first oxygen region 61 are in contact with each other. The p-well region 28 near the gate insulating layer 16 is the channel region of the MOSFET 100.

The gate electrode 20 is positioned on a side of the first plane P1 of the silicon carbide layer 10. The gate electrode 20 is provided on the gate insulating layer 16. The gate insulating layer 16 is interposed between the gate electrode 20 and the drift region 26, source region 30, and p-well region 28.

The gate electrode 20 is a conductor. The gate electrode 20 is, for example, polycrystalline silicon including an n-type impurity or a p-type impurity. The gate electrode 20 may be, for example, metal such as titanium nitride, tungsten nitride, tungsten, aluminum, copper, ruthenium, cobalt, nickel, cobalt silicide, or nickel silicide, or a stacked structure of the metal and polycrystalline silicon including an n-type impurity or a p-type impurity.

The interlayer insulating layer 22 is formed on the gate electrode 20. The interlayer insulating layer 22 electrically separates the gate electrode 20 and the source electrode 12. The interlayer insulating layer 22 is, for example, silicon oxide.

The metal silicide layer 23 is provided between the source region 30 and the source electrode 12. The metal silicide layer 23 is provided between the p-well contact region 32 and the source electrode 12.

The metal silicide layer 23 is in contact with the source region 30. The metal silicide layer 23 is in contact with the p-well contact region 32.

The metal silicide layer 23 is, for example, nickel silicide or titanium silicide.

The source electrode 12 is positioned on a side of the first plane P1 of the silicon carbide layer 10. The source electrode 12 is in contact with the source region 30 and the p-well contact region 32. The source electrode 12 is electrically connected to the source region 30 and the p-well contact region 32. The source electrode 12 also functions as a p-well electrode that applies electric potential to the p-well region 28.

The source electrode 12 includes a stack of, for example, a barrier metal layer and a metal layer on the barrier metal layer. The barrier metal layer includes, for example, titanium nitride. The metal layer includes, for example, aluminum. The barrier metal layer and the metal layer may form alloy by a reaction.

The drain electrode 14 is positioned on a side of the second plane P2 of the silicon carbide layer 10. The drain electrode 14 is in contact with the drain region 24. The drain electrode 14 is electrically connected to the drain region 24.

The drain electrode 14 is, for example, nickel. The nickel may react with the silicon carbide layer 10 to form nickel silicide. The nickel silicide is, for example, NiSi or $Ni_2Si$.

In the semiconductor device according to the first embodiment, an n-type impurity is, for example, nitrogen or phosphorus. It is also possible to apply arsenic (As) or antimony (Sb) as an n-type impurity.

In the semiconductor device according to the first embodiment, a p-type impurity is, for example, aluminum. Boron (B), gallium (Ga), or indium (In) can also be applied as a p-type impurity.

Next, an example of a method for manufacturing the semiconductor device according to the first embodiment will be described.

Figure 9:
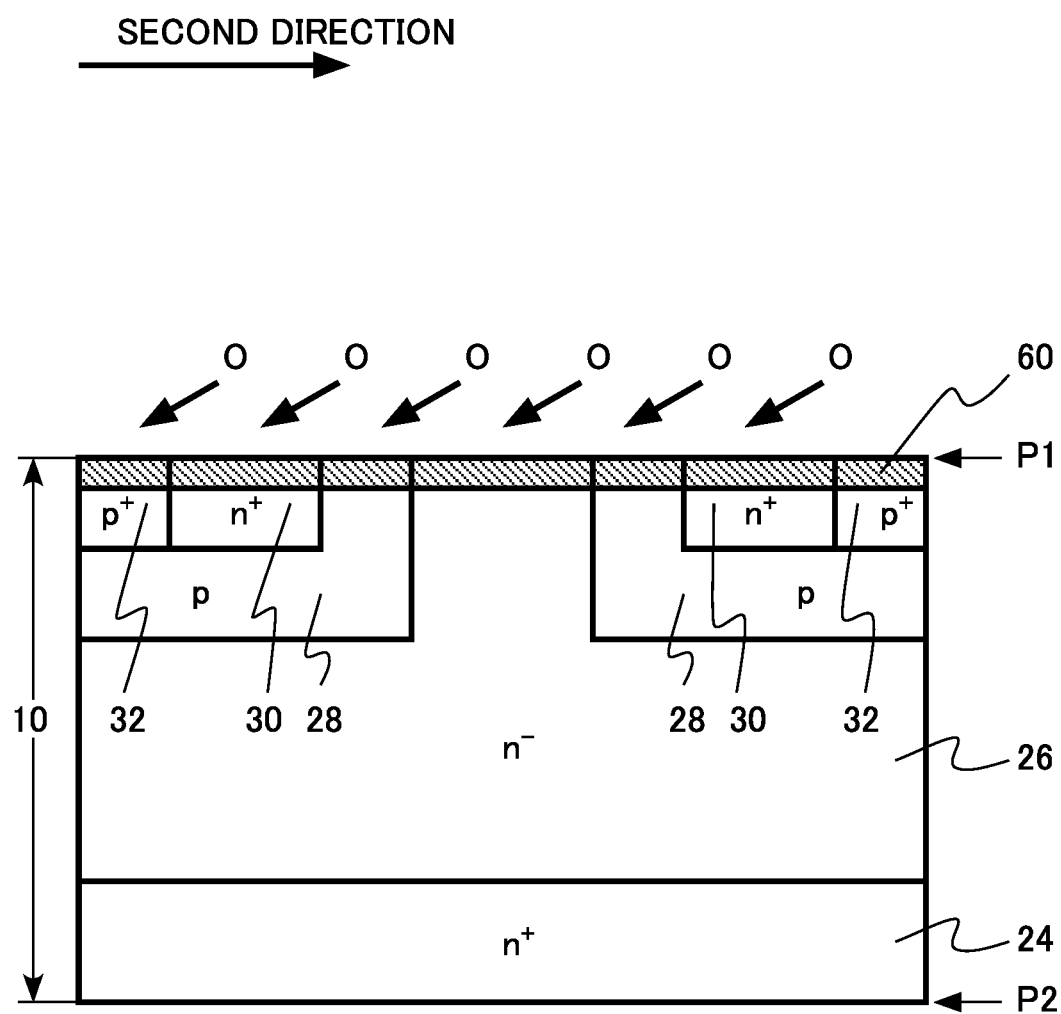
FIG. 9 is a diagram illustrating an example of a method for manufacturing the semiconductor device according to the first embodiment.
Figure 10:
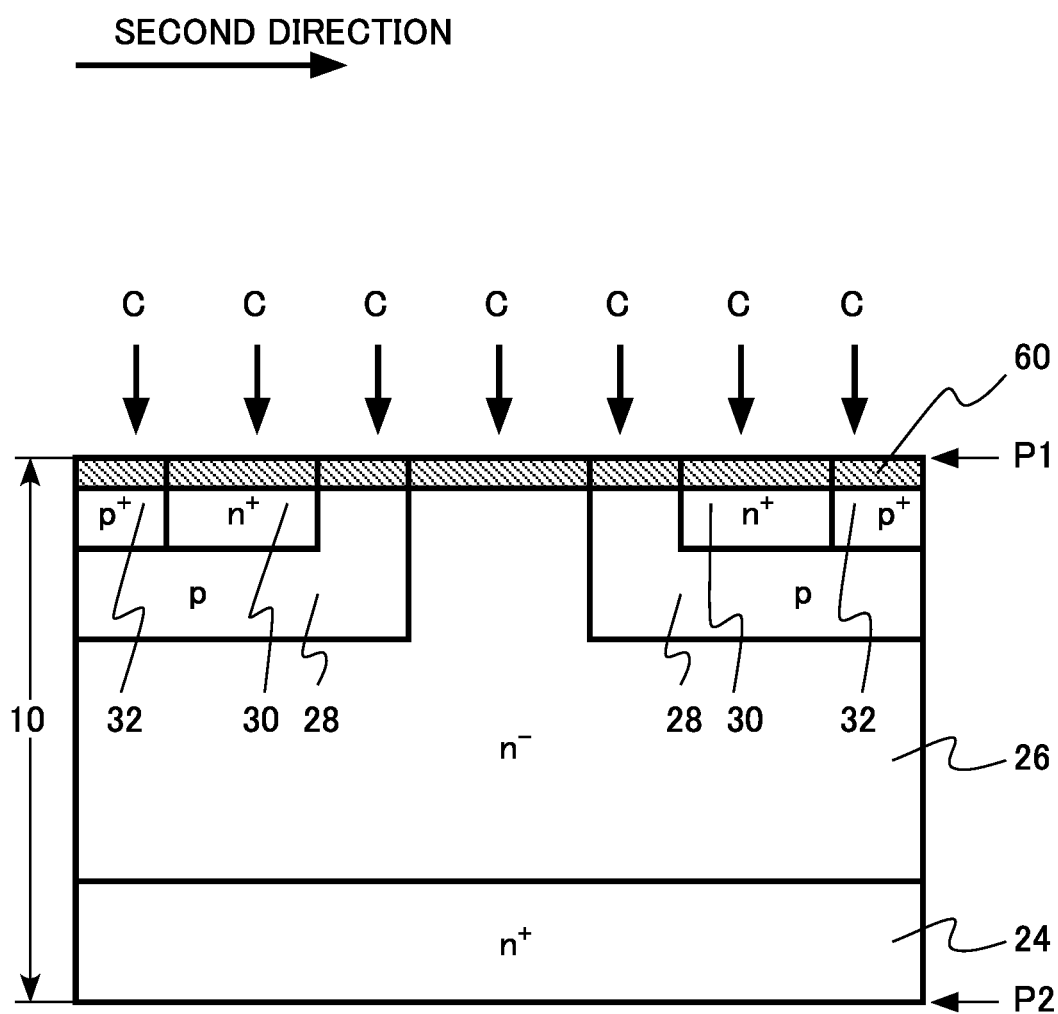
FIG. 10 is a diagram illustrating an example of a method for manufacturing the semiconductor device according to the first embodiment.
Figure 11:
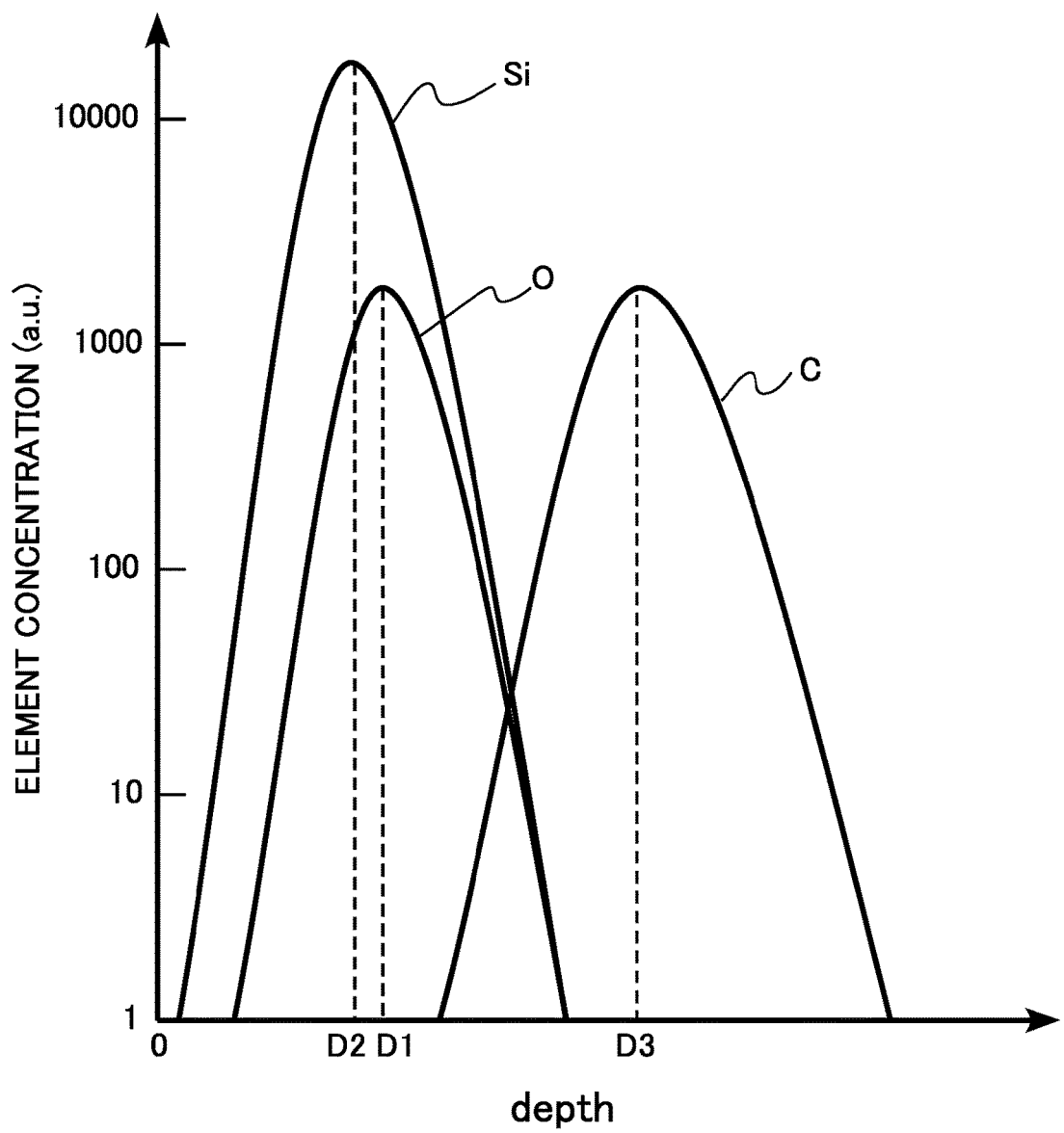
FIG. 11 is a diagram illustrating an example of a method for manufacturing the semiconductor device according to the first embodiment.

FIGS. 6, 7, 8, 9, 10, 11, 12, 13, and 14 are diagrams illustrating an example of a method for manufacturing the semiconductor device according to the first embodiment. FIGS. 6, 7, 8, 9, 10, 12, 13, and FIG. 14 illustrate a cross section corresponding to FIG. 1. FIG. 11 illustrates profiles of ion implantation.

Figure 6:
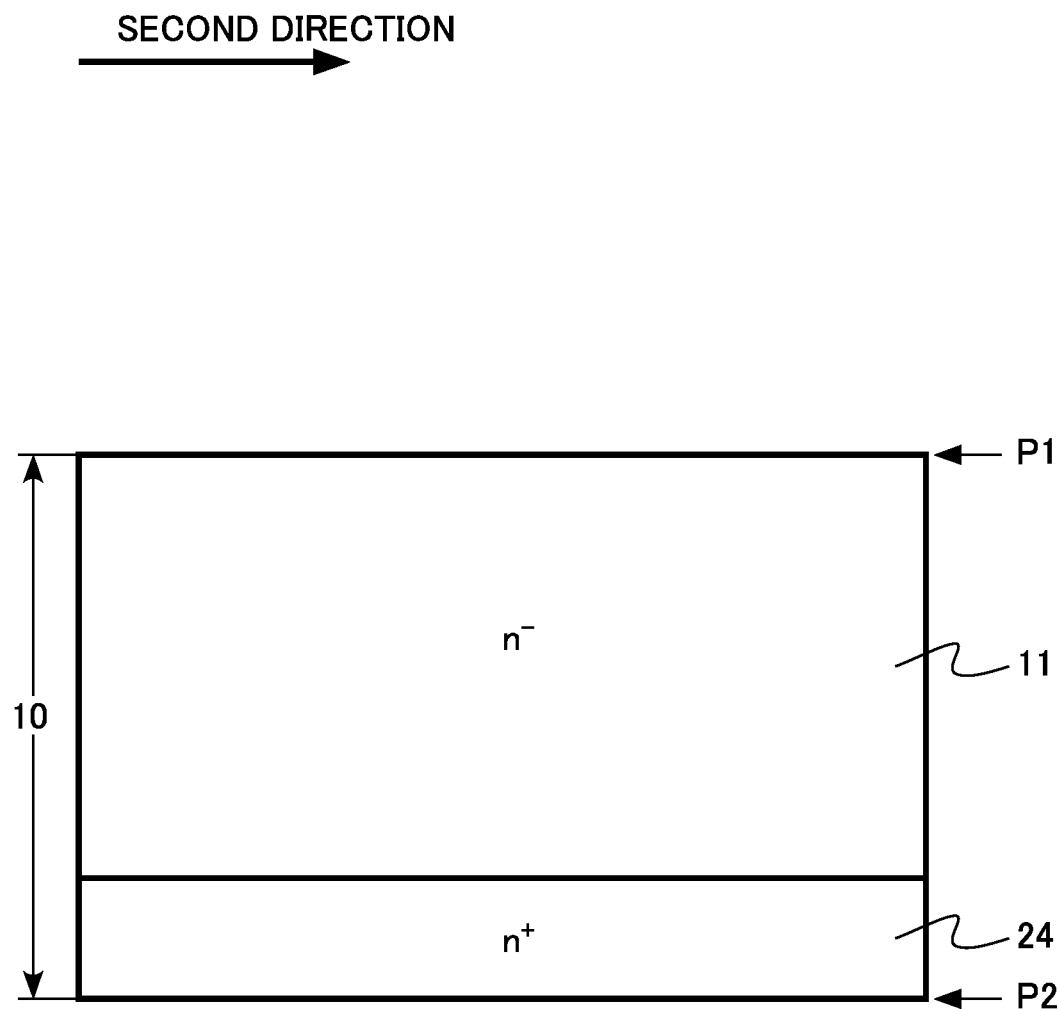
FIG. 6 is a diagram illustrating an example of a method for manufacturing the semiconductor device according to the first embodiment.

First, the silicon carbide layer 10 having a silicon carbide region 11 of $n^-$-type, which is formed on the drain region 24, is prepared (FIG. 6). The silicon carbide region 11 of $n^-$-type is formed by, for example, an epitaxial growth method. A portion of the silicon carbide region 11 finally becomes a drift region 26 of $n^-$-type.

Figure 7:
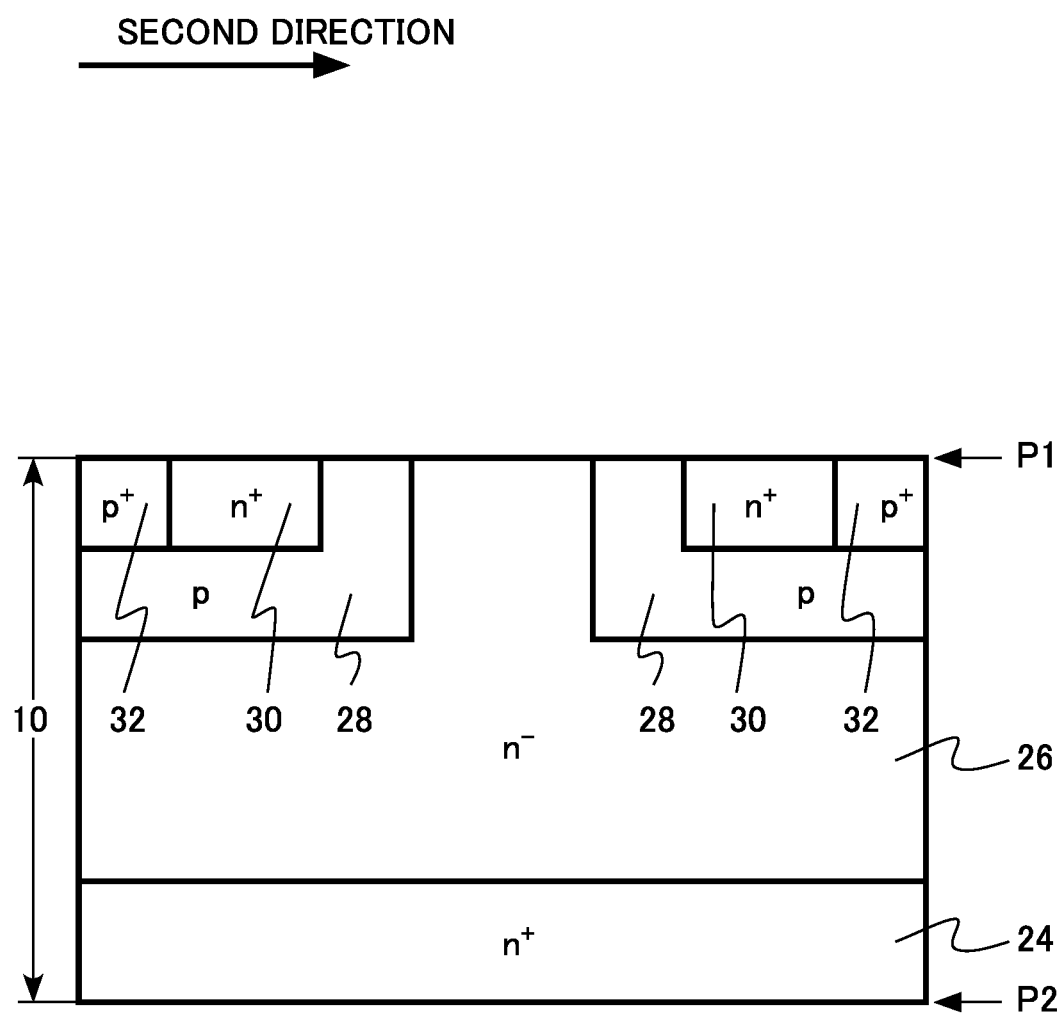
FIG. 7 is a diagram illustrating an example of a method for manufacturing the semiconductor device according to the first embodiment.

Next, the p-well region 28, the source region 30, and the p-well contact region 32 are formed in the silicon carbide region 11 by using a known lithography method and ion implantation method (FIG. 7).

Figure 8:
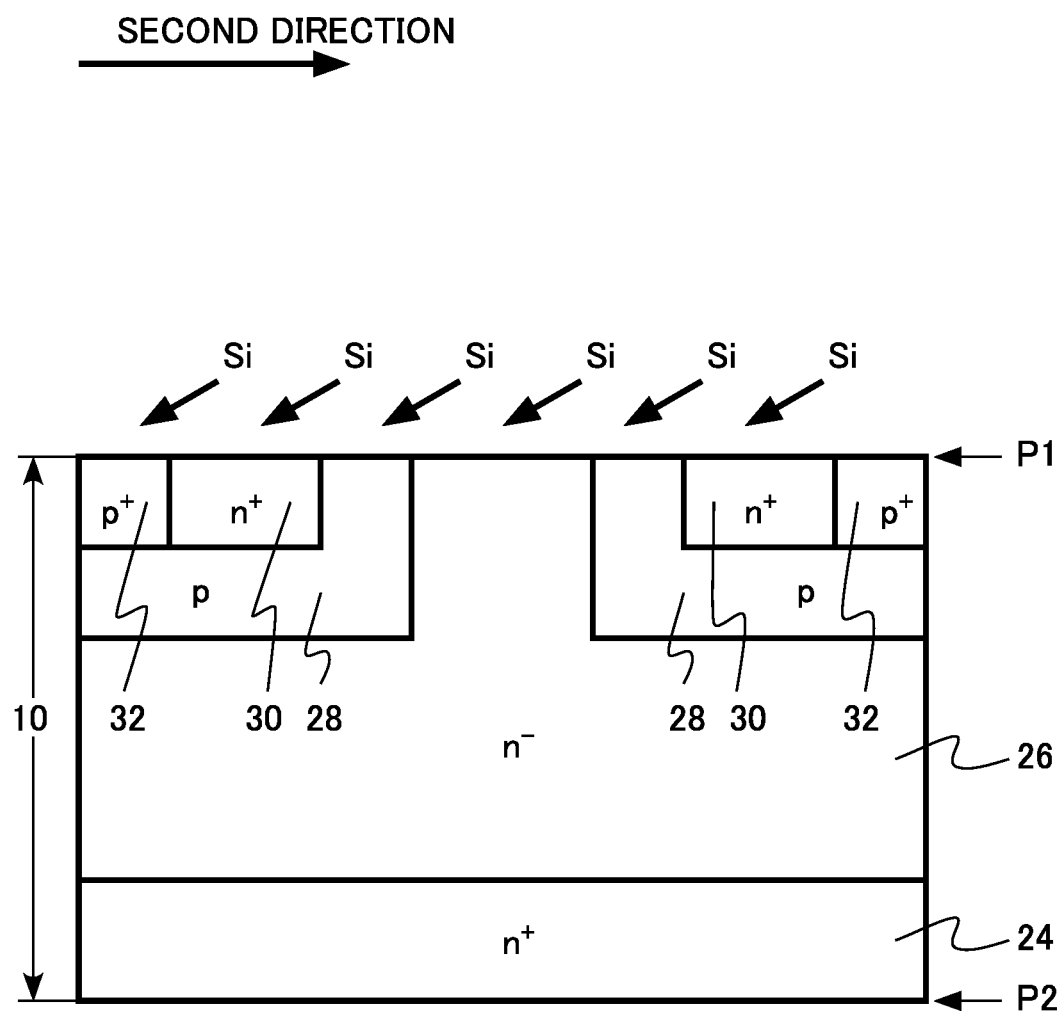
FIG. 8 is a diagram illustrating an example of a method for manufacturing the semiconductor device according to the first embodiment.

Next, silicon is ion-implanted in the silicon carbide layer 10 by a known ion implantation method (FIG. 8). The silicon is ion-implanted in, for example, an entire surface of the silicon carbide layer 10.

For ion implantation of silicon, for example, a tilted angle ion implantation method is used. By using the tilted angle ion implantation method, silicon can be introduced in a shallow position of the silicon carbide layer 10. An ion implantation direction of silicon and a normal line of the surface of the silicon carbide layer 10 form a tilt angle of, for example, 45 degrees or more.

Next, oxygen is ion-implanted in the silicon carbide layer 10 by a known ion implantation method, and the oxygen region 60 is formed (FIG. 9). The oxygen region 60 is formed on the surface of the silicon carbide layer 10. The oxygen region 60 is formed on a surface of the p-well region 28 of the silicon carbide layer 10, a surface of the drift region 26, a surface of the source region 30, and a surface of the p-well contact region 32. portions of the oxygen region 60 finally becomes the first oxygen region 61, the second oxygen region 62, and the third oxygen region 63.

The oxygen is ion-implanted from, for example, the entire surface of the silicon carbide layer 10. The ion implantation of oxygen breaks a carbon bond in the silicon carbide layer 10 and increases carbon vacancies in the silicon carbide layer 10.

For ion implantation of oxygen, for example, a tilted angle ion implantation method is used. By using the tilted angle ion implantation method, oxygen can be introduced in a shallow position of the silicon carbide layer 10. An ion implantation direction of oxygen and a normal line of the surface of the silicon carbide layer 10 form a tilt angle of, for example, 45 degrees or more. Oxygen is ion-implanted, for example, from the same direction as the silicon is ion-implanted.

In a case where the surface of the silicon carbide layer 10 has an off-angle, for example, ions are implanted from a direction rotated by 90 degrees from a direction of the off-angle. As a result, ions can be uniformly implanted in a terrace on the surface of the silicon carbide layer 10.

The ion implantation of silicon disturbs a crystal structure near the surface of the silicon carbide layer 10. The ion implantation of silicon, for example, amorphizes a portion near the surface of the silicon carbide layer 10.

The ion implantation of silicon before the ion implantation of oxygen reduces chances of channeling during the ion implantation of oxygen. Therefore, it is possible to suppress deepening of the oxygen region 60. Ion implantation of silicon can be performed after ion implantation of oxygen.

With the tilted angle ion implantation method, an ion implantation region can be limited to a portion near the surface. Moreover, because chances of channeling are reduced, an implanted ion can be immediately stopped near the surface. Therefore, according to the tilted angle ion implantation method, it is possible to limit distribution of ions during implantation to an extremely shallow region near the surface.

Next, carbon is ion-implanted in the silicon carbide layer 10 by a known ion implantation method (FIG. 10). The carbon is ion-implanted in, for example, the entire surface of the silicon carbide layer 10.

FIG. 11 illustrates profiles of ion implantation of oxygen (O), silicon (Si), and carbon (C). The horizontal axis represents depth from the surface of the silicon carbide layer 10, and the vertical axis represents element concentration.

In FIG. 11, first depth D1 represents depth at which oxygen concentration is maximized after the ion implantation, second depth D2 represents depth at which silicon concentration is maximized after the ion implantation, and third depth D3 represents depth at which carbon concentration is maximized after the ion implantation.

The first depth D1 and the second depth D2 are less than the third depth D3. The first depth D1 and the second depth D2 are, for example, 15 nm or less. The first depth D1 and the second depth D2 are, for example, 10 nm or less. The first depth D1 and the second depth D2 are, for example, 5 nm or less. The third depth D3 is, for example, 10 nm or more and 30 nm or less. Difference between the first depth D1 and the second depth D2 is, for example, 2 nm or less.

For example, a profile of the ion implantation of silicon covers an entire profile of the ion implantation of oxygen. Proximity of silicon near oxygen facilitates oxygen entry into a carbon site of a crystal structure of silicon carbide.

For example, a profile of the ion implantation of carbon is positioned well behind a profile of the ion implantation of oxygen. Presence of carbon fills a carbon vacancy and hinders oxygen from diffusing. Therefore, diffusion of oxygen in a depth direction of the silicon carbide layer 10 is suppressed.

Figure 12:
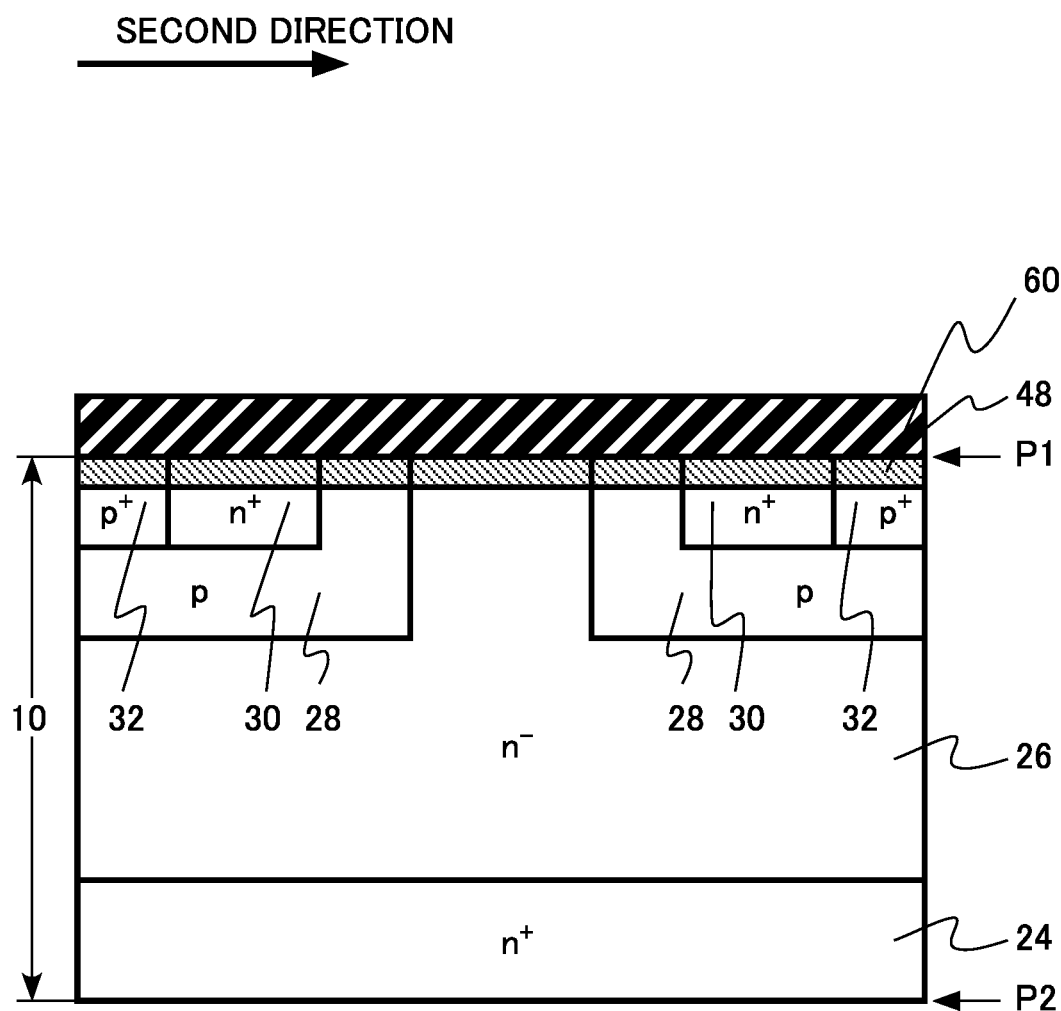
FIG. 12 is a diagram illustrating an example of a method for manufacturing the semiconductor device according to the first embodiment.

Next, carbon film 48 is formed on the surface of the silicon carbide layer 10. Then, heat treatment is performed to activate the elements introduced by the ion implantation in the silicon carbide layer 10 (FIG. 12). By the heat treatment, oxygen atoms fill a large number of carbon vacancies formed near the surface of the silicon carbide layer 10. In other words, oxygen atoms each bonded to four silicon atoms are formed. In other words, a large number of first structures in which one oxygen atom substitutes for a carbon atom of a crystal structure of silicon carbide are formed.

During the heat treatment, oxygen exists as an atom in the first oxygen region 61. Therefore, formation of the first structure in which one oxygen atom substitutes for a carbon atom of a crystal structure of silicon carbide is promoted more than formation of the second structure in which two oxygen atoms substitute for a carbon atom.

During the heat treatment, there is a silicon atom in the first oxygen region 61. Therefore, formation of the first structure in which one oxygen atom substitutes for a carbon atom of a crystal structure of silicon carbide is promoted more than formation of the third structure in which one oxygen atom substitutes for a silicon atom of a crystal structure of silicon carbide.

Further, during the heat treatment, carbon concentration is higher than oxygen concentration in a region deeper than the first oxygen region 61. Therefore, as compared to an oxygen atom, a carbon atom preferentially enters a carbon defect in the region deeper than the first oxygen region 61, and the first structure is difficult to be formed.

Figure 13:
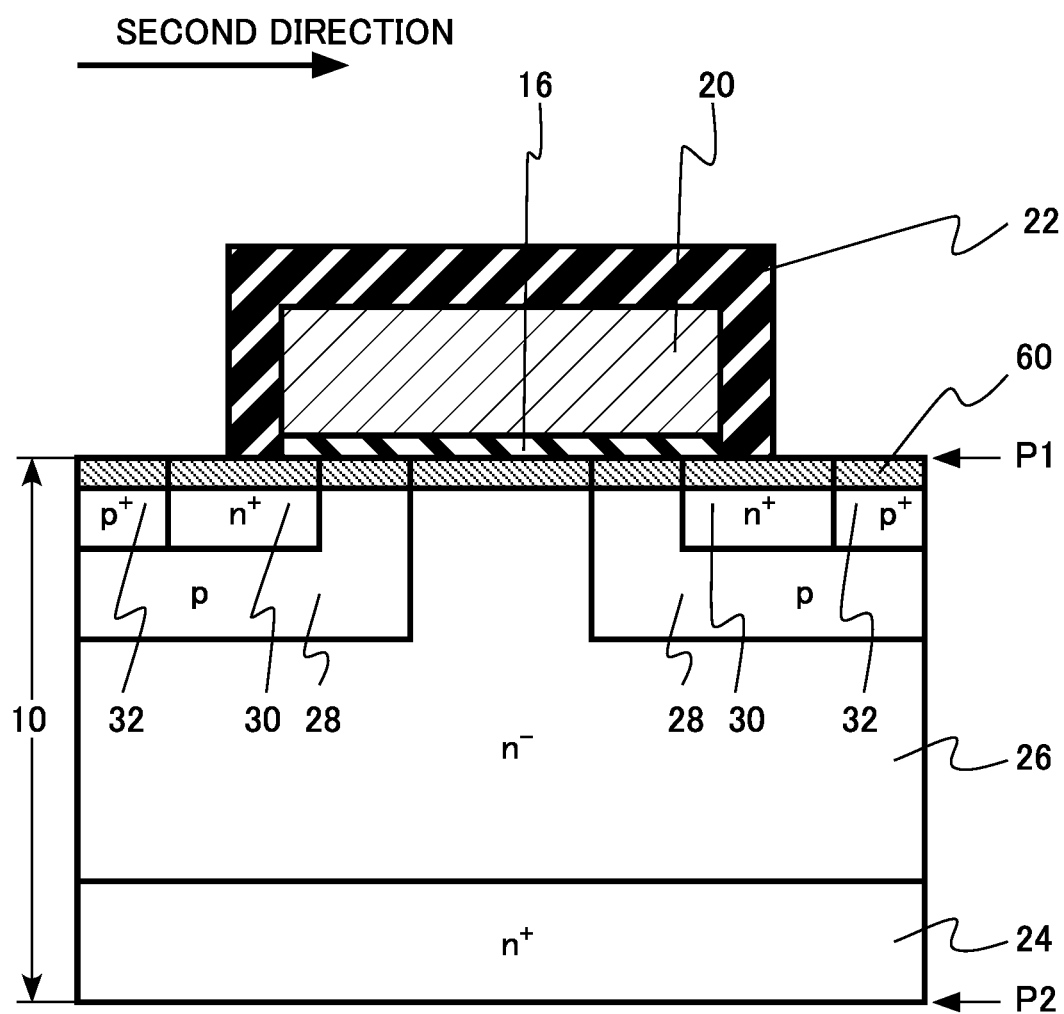
FIG. 13 is a diagram illustrating an example of a method for manufacturing the semiconductor device according to the first embodiment.

Next, after the carbon film 48 is removed, the gate insulating layer 16 and the gate electrode 20 are formed on the surface of the silicon carbide layer 10 by using a known process technique. The gate insulating layer 16 and the gate electrode 20 are formed, for example, by using a chemical vapor deposition method (CVD method). Further, an interlayer insulating layer 22 is formed on the gate electrode 20 by using a known process technique (FIG. 13).

During heat treatment, excess carbon or silicon in the silicon carbide layer 10 is absorbed by the carbon film 48. By removing the carbon film 48, excess carbon or silicon can be removed. In this way, the excess carbon or silicon of the silicon carbide layer 10 can be removed. Therefore, a characteristic of the MOSFET 100 does not degrade even if a large amount of carbon or silicon is ion-implanted in order to form the first structure.

Figure 14:
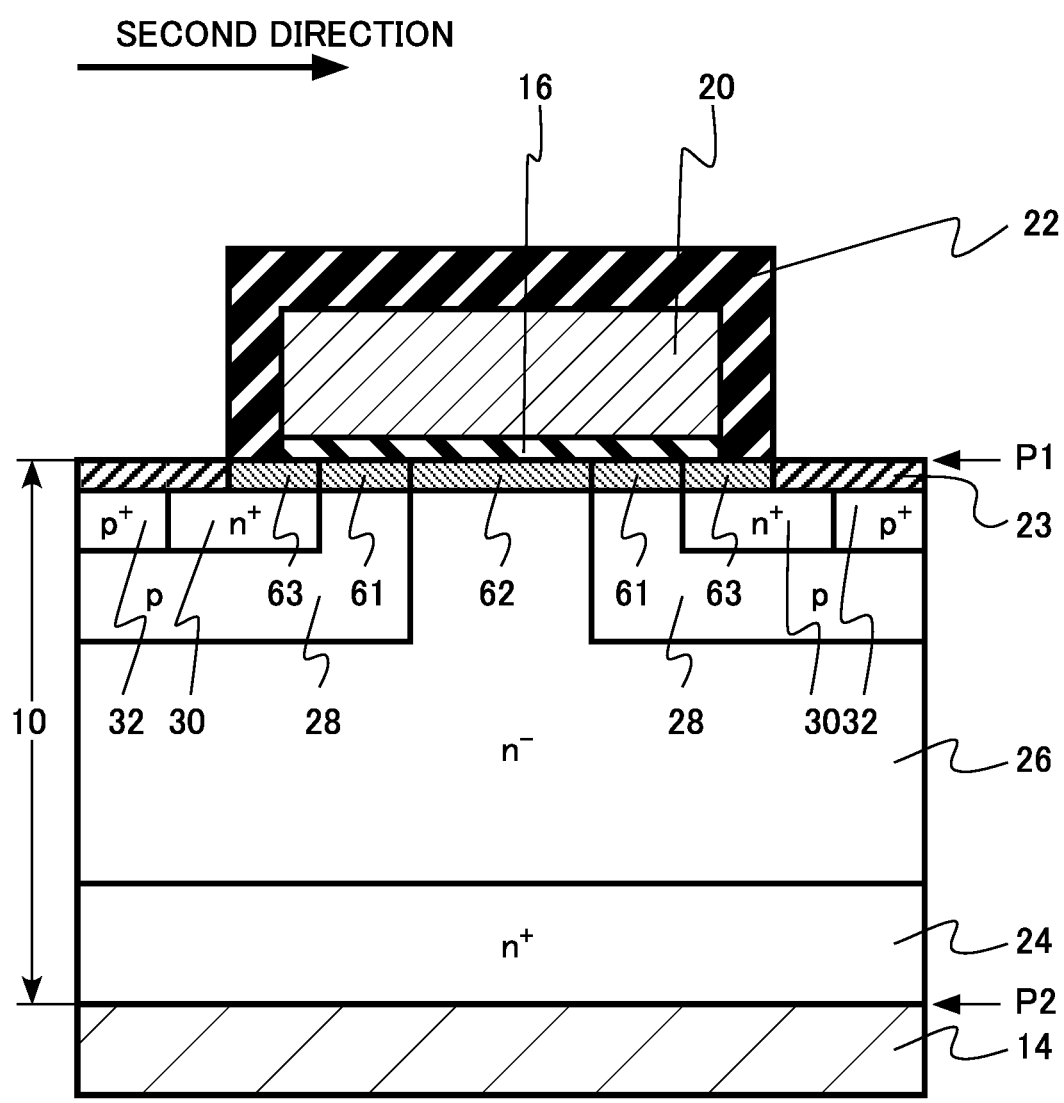
FIG. 14 is a diagram illustrating an example of a method for manufacturing the semiconductor device according to the first embodiment.

Next, the metal silicide layer 23 is formed on the first plane P1 (FIG. 14). The metal silicide layer 23 is formed, for example, by deposition of metal film (not illustrated) and heat treatment. By the heat treatment, a silicidation reaction occurs between the metal film and the silicon carbide layer 10, and the metal silicide layer 23 is formed.

After the heat treatment, unreacted metal film is removed by, for example, wet etching.

Due to the silicidation reaction between the metal film and the silicon carbide layer 10, the oxygen region 60 on a portion of the surface of the source region 30 and the oxygen region 60 on the surface of the p-well contact region 32 disappear.

Then, the source electrode 12 and the drain electrode 14 are formed by using a known process technique. The MOSFET 100 illustrated in FIG. 1 is manufactured by the above-described manufacturing method.

Next, functions and effects of the semiconductor device according to the first embodiment will be described.

In a MOSFET using silicon carbide, for example, threshold voltage and mobility tend to be low as compared with a MOSFET using silicon. Therefore, a MOSFET that can achieve high threshold voltage and high mobility is desired.

In the MOSFET 100 according to the first embodiment, the first oxygen region 61 is provided between the gate insulating layer 16 and the p-well region 28. By having the first oxygen region 61, high threshold voltage and high mobility are achieved in the MOSFET 100. Details will be described below.

Figure 15:
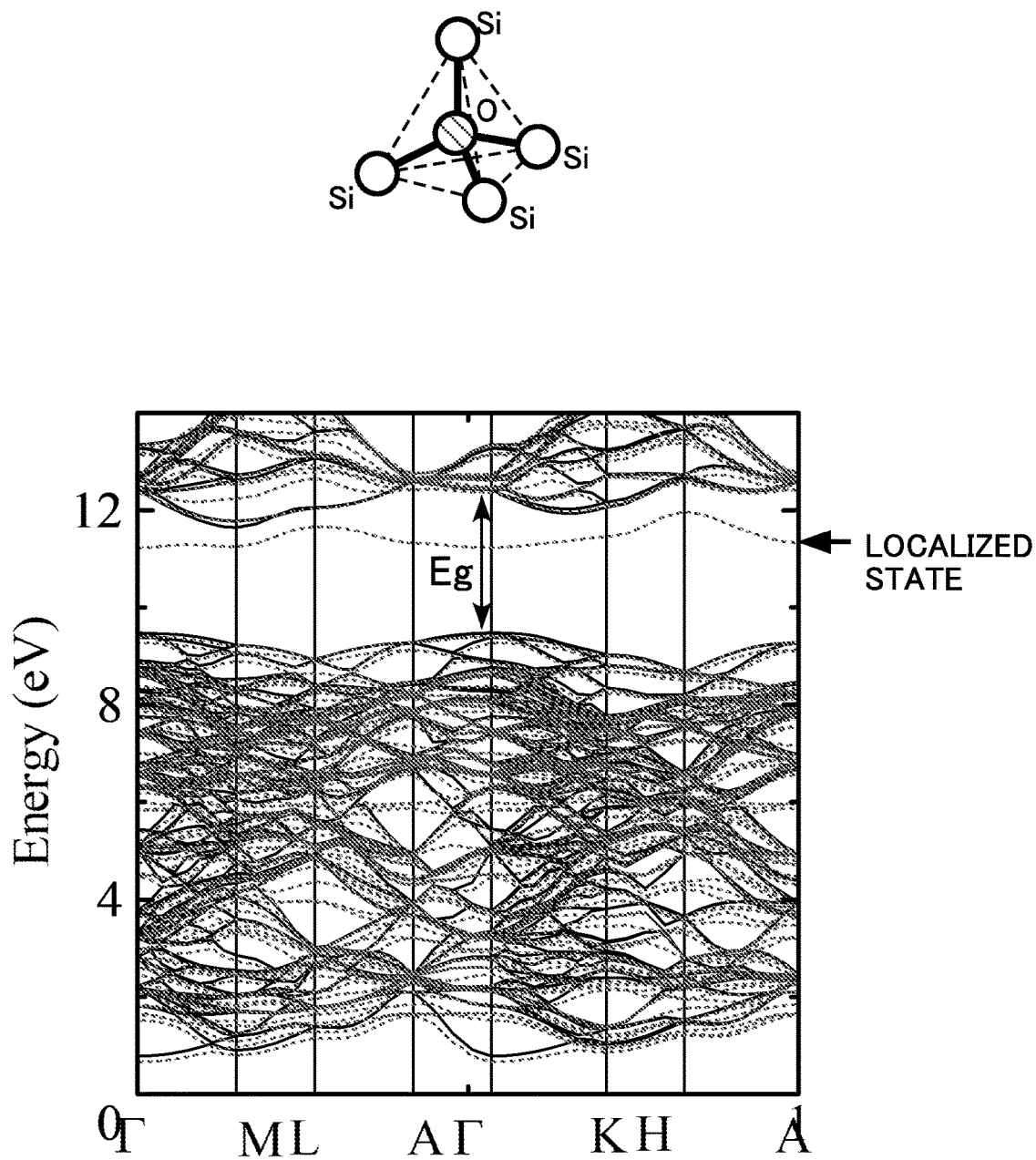
FIG. 15 is a diagram illustrating an electronic state of the semiconductor device according to the first embodiment.

FIG. 15 is a diagram illustrating an electronic state of the semiconductor device according to the first embodiment. An electronic state of one oxygen atom positioned in a position of a carbon atom (carbon site) in a crystal structure of silicon carbide is obtained by first principle calculation. That is, an electronic states of silicon carbide in which a first structure including an oxygen atom bonded to four silicon atoms exists is obtained by first principle calculation.

As illustrated in FIG. 15, in a case where there is an oxygen atom at a carbon site, a level is formed at a deep position away from a lower end of a conduction band. In a case where there is an oxygen atom at the carbon site, a localized state is formed at a deep position away from the lower end of the conduction band.

The localized state is formed at a position of about 0.8 eV from the lower end of the conduction band. Difference in energy between the localized state and the lower end of the conduction band is, for example, 0.7 eV or more and 1.0 eV or less.

There is a first structure in the first oxygen region 61 of the MOSFET 100 according to the first embodiment. Therefore, a deep level is formed in the first oxygen region 61.

Figure 16A:
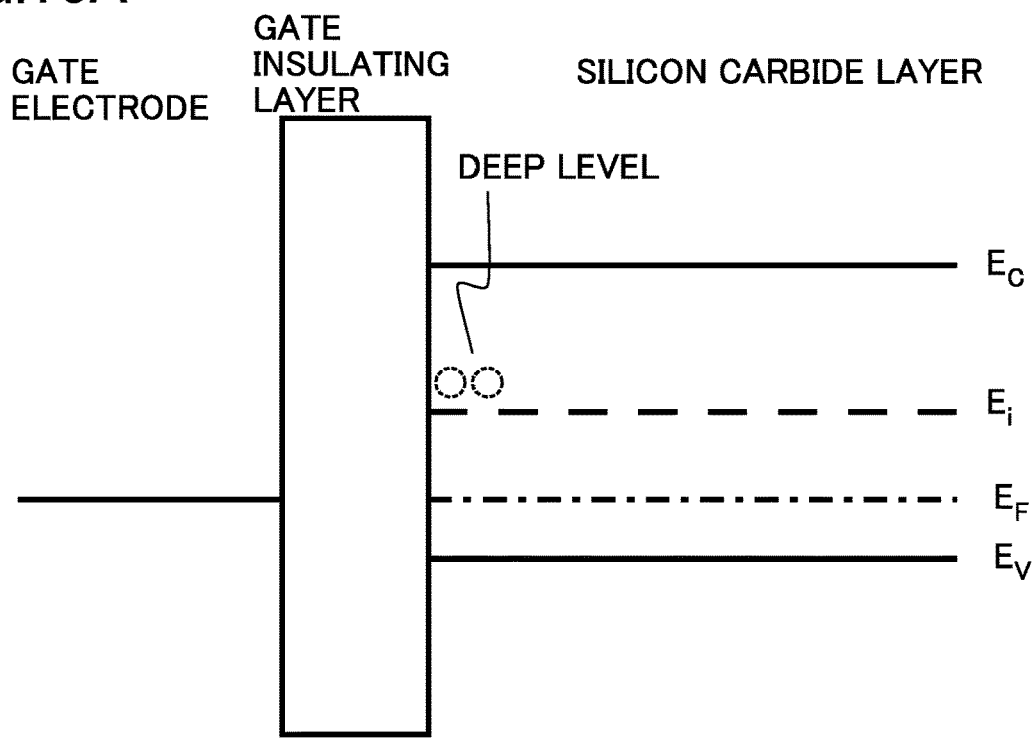
FIGS. 16A and 16B are explanatory diagrams of a function and effect of the semiconductor device according to the first embodiment.
Figure 16B:
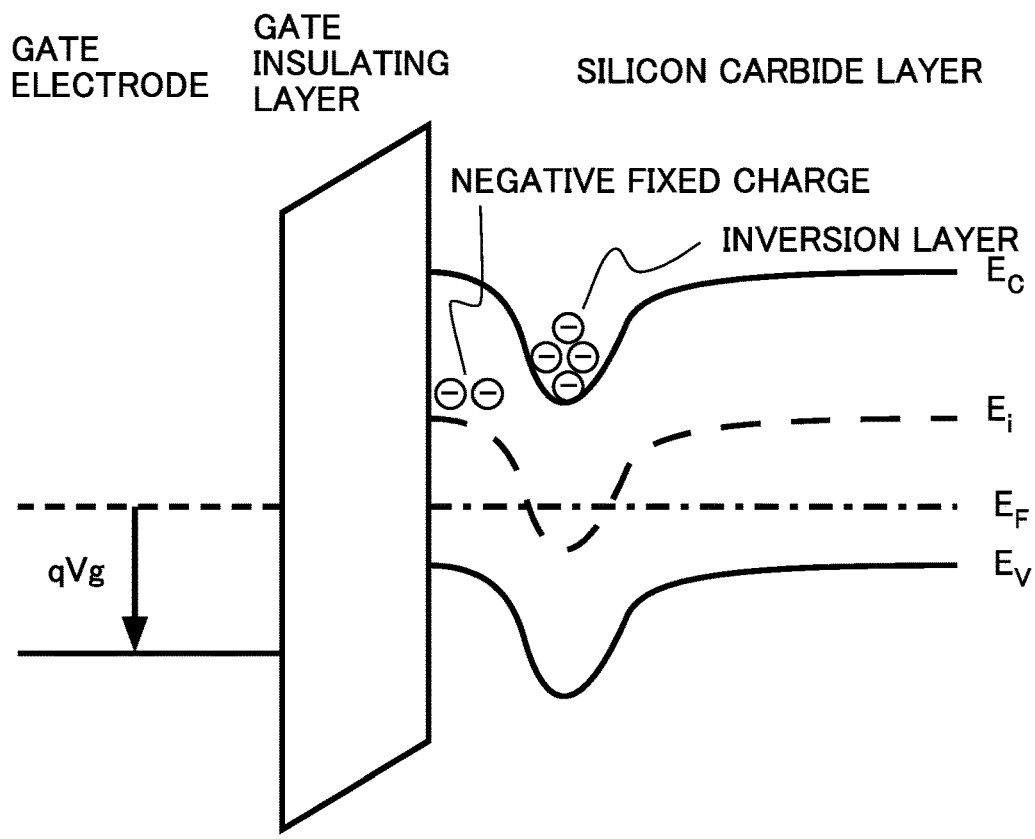

FIGS. 16A and 16B are explanatory diagrams of a function and effect of the semiconductor device according to the first embodiment. FIGS. 16A and 16B illustrate band diagrams of a metal-oxide-semiconductor (MOS) structure of the MOSFET 100. FIGS. 16A and 16B illustrate a case where the silicon carbide layer is the p-well region 28. FIGS. 16A and 16B illustrate a case where the silicon carbide layer is SiC of p-type.

FIG. 16A is a band diagram of a flat band state in which no voltage is applied between the source electrode 12 and the gate electrode 20. FIG. 16B is a band diagram illustrating a state in which positive voltage (Vg in FIG. 16B) is applied to the gate electrode 20 to form an inversion layer. Note that FIGS. 16A and 16B illustrate an ideal case where a work function of the gate electrode 20 and a Fermi level of the silicon carbide layer 10 are equal.

As illustrated in FIG. 16A, there is a deep level, which is formed by an oxygen atom entering a carbon site, near an interface between the silicon carbide layer 10 and the gate insulating layer 16. As illustrated in FIG. 16B, when positive voltage is applied to the gate electrode 20, potential near the interface decreases.

When the potential near the interface decreases, electrons are induced, which are trapped in a deep level to form negative fixed charge, as illustrated in FIG. 16B. The formation of the negative fixed charge near the interface increases threshold voltage of the MOSFET 100.

When the negative fixed charge is formed near the interface, potential near the interface increases. Therefore, as illustrated in FIG. 16B, the inversion layer is formed at a deep position away from a portion near the interface. A so-called buried channel is formed.

When a buried channel is formed, electrons flow at a position away from a portion near the interface. Therefore, interfacial scattering of electrons is suppressed, and the mobility of the MOSFET 100 is increased.

A carbon vacancy in the silicon carbide layer 10 forms a shallow level near the lower end of the conduction band. This shallow level decreases the mobility of the MOSFET 100. In the MOSFET 100, the number of carbon vacancies is reduced by filling the carbon vacancies with oxygen included in the first oxygen region 61. Therefore, the mobility of the MOSFET 100 is increased.

Further, if there is a carbon vacancy in the silicon carbide layer, a surface of the silicon carbide layer is easily oxidized. When the surface of the silicon carbide layer is oxidized, a carbon vacancy is further formed. When the surface of the silicon carbide layer is oxidized, a carbon defect due to carbon diffused in the gate insulating layer is generated. Therefore, the mobility of the MOSFET is decreased, or reliability of the gate insulating layer is reduced.

In the MOSFET 100, the number of carbon vacancies is reduced by filling the carbon vacancies with oxygen included in the first oxygen region 61. Therefore, the oxidation resistance of the surface of the silicon carbide layer 10 is improved. Therefore, the number of carbon vacancies in the silicon carbide layer 10 and an amount of carbon diffused in the gate insulating layer 16 are reduced. As a result, the mobility of the MOSFET 100 is increased. At the same time, reliability of the gate insulating layer 16 is increased.

Oxygen concentration at the first position X, which is 20 nm away from the interface between the gate insulating layer 16 and the silicon carbide layer 10 toward the silicon carbide layer 10, is, for example, preferably less than $1 \times 10^{17}$ cm$^{-3}$, more preferably less than $1 \times 10^{16}$ cm$^{-3}$, and further preferably less than $1 \times 10^{15}$ cm$^{-3}$. When the oxygen concentration at the first position X is lower than the above-described upper limit values, the buried channel approaches the interface between the gate insulating layer 16 and the silicon carbide layer 10. By the buried channel approaching the interface between the gate insulating layer 16 and the silicon carbide layer 10, controllability by gate voltage of the MOSFET 100 is improved.

By controllability being improved by the gate voltage of the MOSFET 100, for example, operating voltage of the MOSFET 100 can be lowered. As a result, for example, leakage current of the gate insulating layer is reduced. Leakage current between source and drain is reduced. Further, a short-channel effect can be suppressed.

Oxygen concentration in the first oxygen region 61 is preferably $1 \times 10^{17}$ cm$^{-3}$ or more, more preferably $2 \times 10^{18}$ cm$^{-3}$ or more, further preferably $3 \times 10^{19}$ cm$^{-3}$ or more, further preferably $3 \times 10^{20}$ cm$^{-3}$ or more, and further preferably $3 \times 10^{21}$ cm$^{-3}$ or more. By the above-described lower limit values being exceeded, threshold voltage and mobility of the MOSFET 100 are increased.

For example, if the oxygen concentration in the first oxygen region 61 is $3 \times 10^{19}$ cm$^{-3}$ or more, threshold voltage is about 1 V higher than threshold voltage in a case where there is no first oxygen region 61. If the oxygen concentration in the first oxygen region 61 is $3 \times 10^{20}$ cm$^{-3}$ or more, threshold voltage is about 5 V higher than threshold voltage in a case where there is no first oxygen region 61.

Oxygen concentration in the first oxygen region 61 is preferably $1 \times 10^{23}$ cm$^{-3}$ or less, more preferably $5 \times 10^{22}$ cm$^{-3}$ or less, further preferably $1 \times 10^{22}$ cm$^{-3}$ or less, and further preferably $5 \times 10^{21}$ cm$^{-3}$ or less. By the above-described upper limit value not being reached, the number of oxygen atoms entering silicon sites and the number of oxygen atoms sitting between lattices of silicon carbide are reduced, and the mobility of the MOSFET 100 is further increased.

If the oxygen concentration in the first oxygen region 61 is higher than $1 \times 10^{23}$ cm$^{-3}$, interfacial potential rises significantly, by which the channel moves to deeper position of the silicon carbide layer 10. Therefore, it may be difficult to control inversion operation by gate voltage of the MOSFET 100. Controllability of the inversion operation by gate voltage of the MOSFET 100 is improved by setting the oxygen concentration in the first oxygen region 61 to $5 \times 10^{22}$ cm$^{-3}$ or less, more improved by setting the oxygen concentration in the first oxygen region 61 to $1 \times 10^{22}$ cm$^{-3}$ or less, and further improved by setting the oxygen concentration in the first oxygen region 61 to $5 \times 10^{21}$ cm$^{-3}$ or less.

Density of the oxygen atom bonded to four silicon atoms in the first oxygen region 61 is preferably higher than density of the oxygen atom bonded to two silicon atoms in the first oxygen region 61. In other words, the density of the first structure of the first oxygen region 61 is preferably higher than the density of the second structure of the first oxygen region 61. It is possible to form many deep levels capable of forming negative fixed charge. Therefore, threshold voltage and mobility of the MOSFET 100 are increased.

Density of the oxygen atom bonded to four silicon atoms in the first oxygen region 61 is preferably higher than density of the oxygen atom bonded to a carbon atom in the first oxygen region 61. In other words, the density of the first structure of the first oxygen region 61 is preferably higher than the density of the third structure of the first oxygen region 61. It is possible to form many deep levels capable of forming negative fixed charge. Therefore, threshold voltage and mobility of the MOSFET 100 are increased.

From a viewpoint of increasing threshold voltage and mobility of the MOSFET 100, it is preferable that the oxygen concentration in the first oxygen region 61 be higher than aluminum concentration in the first oxygen region 61.

In the MOSFET 100 according to the first embodiment, the second oxygen region 62 is provided between the gate insulating layer 16 and the drift region 26. In the MOSFET 100 according to the first embodiment, the third oxygen region 63 is provided between the gate insulating layer 16 and the source region 30. By having the second oxygen region 62 and the third oxygen region 63, an effective thickness of the gate insulating layer 16 in the MOSFET 100 becomes thicker. Therefore, reliability of the gate insulating layer 16 is increased. In addition, leakage current of the gate insulating layer 16 is reduced.

Figure 17A:
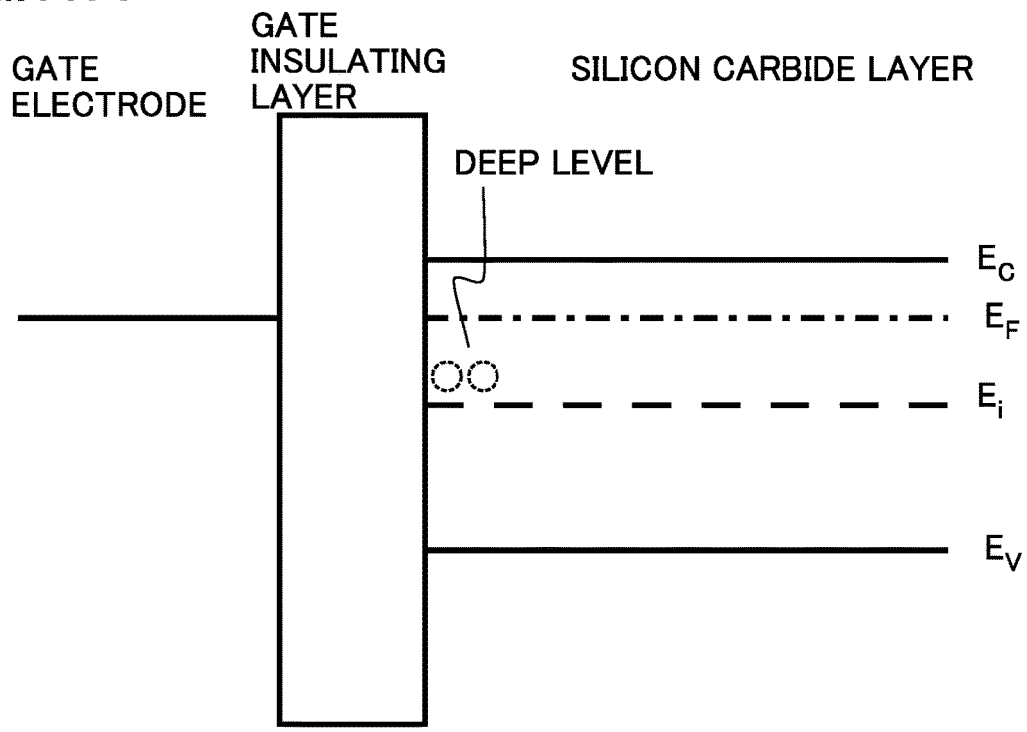
FIGS. 17A and 17B are explanatory diagrams of a function and effect of the semiconductor device according to the first embodiment.
Figure 17B:
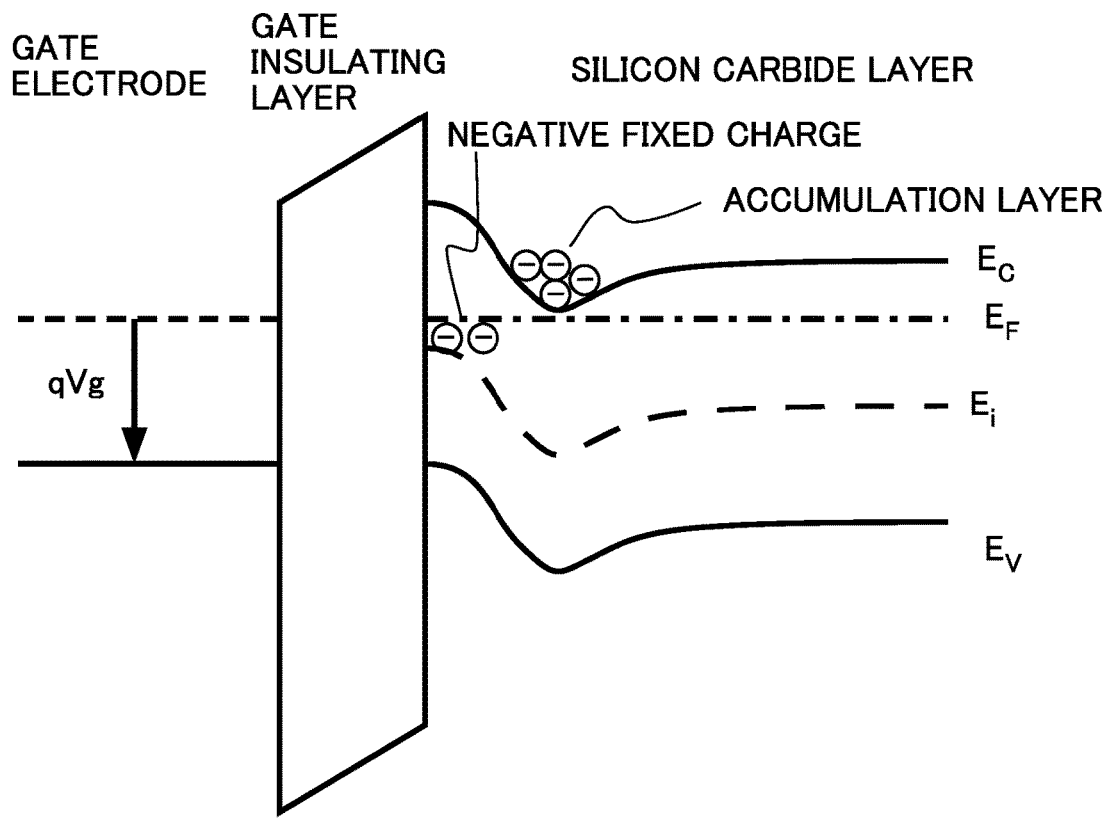

FIGS. 17A and 17B are explanatory diagrams of a function and effect of the semiconductor device according to the first embodiment. FIGS. 17A and 17B illustrate band diagrams of a MOS structure that the MOSFET 100 has. FIGS. 17A and 17B illustrate a case where the silicon carbide layer is the drift region 26 or the source region 30. FIGS. 17A and 17B illustrate a case where the silicon carbide layer is SiC of n-type.

FIG. 17A is a band diagram of a flat band state in which no voltage is applied between the source electrode 12 and the gate electrode 20. FIG. 17B is a band diagram illustrating a state in which positive voltage (Vg in FIG. 17B) is applied to the gate electrode 20 to form an accumulation layer. Note that FIGS. 17A and 17B illustrate an ideal case where a work function of the gate electrode 20 and a Fermi level of the silicon carbide layer 10 are equal.

As illustrated in FIG. 17A, there is a deep level, which is formed by an oxygen atom entering a carbon site, near an interface between the silicon carbide layer 10 and the gate insulating layer 16. As illustrated in FIG. 17B, when positive voltage is applied to the gate electrode 20, potential near the interface decreases.

When the potential of a portion near the interface decreases, electrons are accumulated. As illustrated in FIG. 17B. electrons are trapped in a deep level to form negative fixed charge.

When the negative fixed charge is formed near the interface, potential near the interface increases. Therefore, as illustrated in FIG. 17B, the accumulation layer of the silicon carbide layer 10 is formed at a deep position away from a portion near the interface.

By the accumulation layer being formed at a deep position away from a portion near the interface, capacitance of the surface of the silicon carbide layer 10 is added as capacitance between the gate insulating layer 16 and the silicon carbide layer 10. Therefore, the effective thickness of the gate insulating layer 16 becomes thicker. Therefore, field strength applied to the gate insulating layer 16 decreases. Therefore, dielectric breakdown tolerance of the gate insulating layer 16 is improved, and reliability of the gate insulating layer 16 is increased. In addition, leakage current of the gate insulating layer 16 is reduced.

Oxygen concentration in the second oxygen region 62 and the third oxygen region 63 is preferably $1 \times 10^{17}$ cm$^{-3}$ or more, more preferably $2 \times 10^{18}$ cm$^{-3}$ or more, further preferably $3 \times 10^{19}$ cm$^{-3}$ or more, further preferably $3 \times 10^{20}$ cm$^{-3}$ or more, and further preferably $3 \times 10^{21}$ cm$^{-3}$ or more. By the above-described lower limit values being exceeded, the effective thickness of the gate insulating layer 16 becomes thicker, reliability of the gate insulating layer 16 of the MOSFET 100 is further increased, and leakage current of the gate insulating layer 16 is further reduced.

(First Modification)

Figure 18:
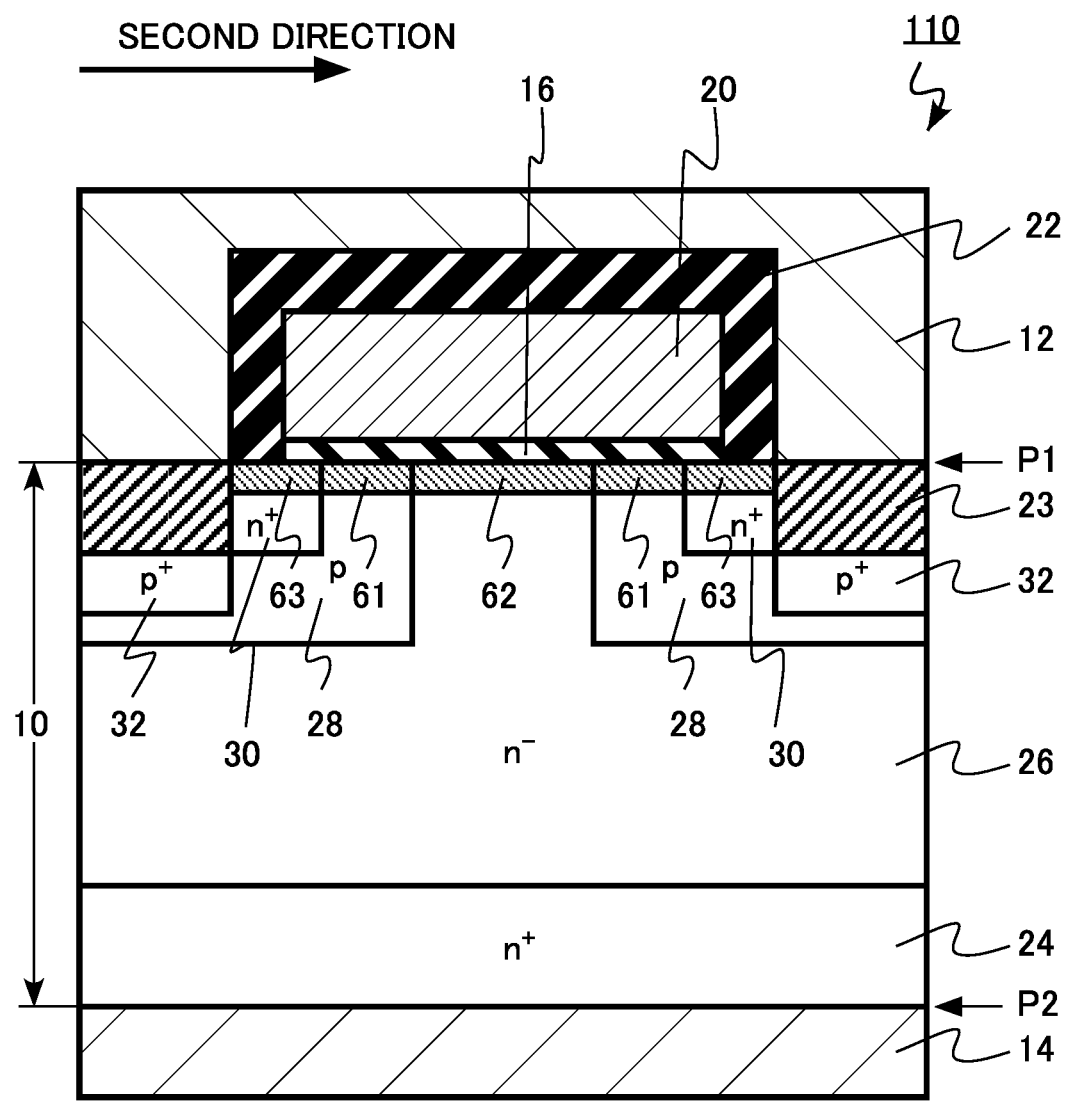
FIG. 18 is a schematic cross-sectional view of a semiconductor device according to a first modification of the first embodiment.

FIG. 18 is a schematic cross-sectional view of a semiconductor device according to a first modification of the first embodiment. The semiconductor device according to the first modification of the first embodiment is a MOSFET 110. The MOSFET 110 differs from the MOSFET 100 according to the first embodiment in that a side face of a metal silicide layer 23 is in contact with a source region 30.

A bottom face of the metal silicide layer 23 is in contact with a p-well contact region 32. The side face of the metal silicide layer 23 is in contact with the source region 30.

The metal silicide layer 23 is, for example, nickel silicide or titanium silicide.

In the MOSFET 110, electrical continuity between the source region 30 and a source electrode 12 is ensured on the side face of the metal silicide layer 23. Therefore, it is possible to reduce an area required for ensuring electrical continuity between a source electrode 12 and the source region 30 on a first plane P1 of a silicon carbide layer 10. Therefore, a chip size of the MOSFET 110 can be reduced. In addition, on-resistance per unit area of the MOSFET 110 can be reduced.

(Second Modification)

Figure 19:
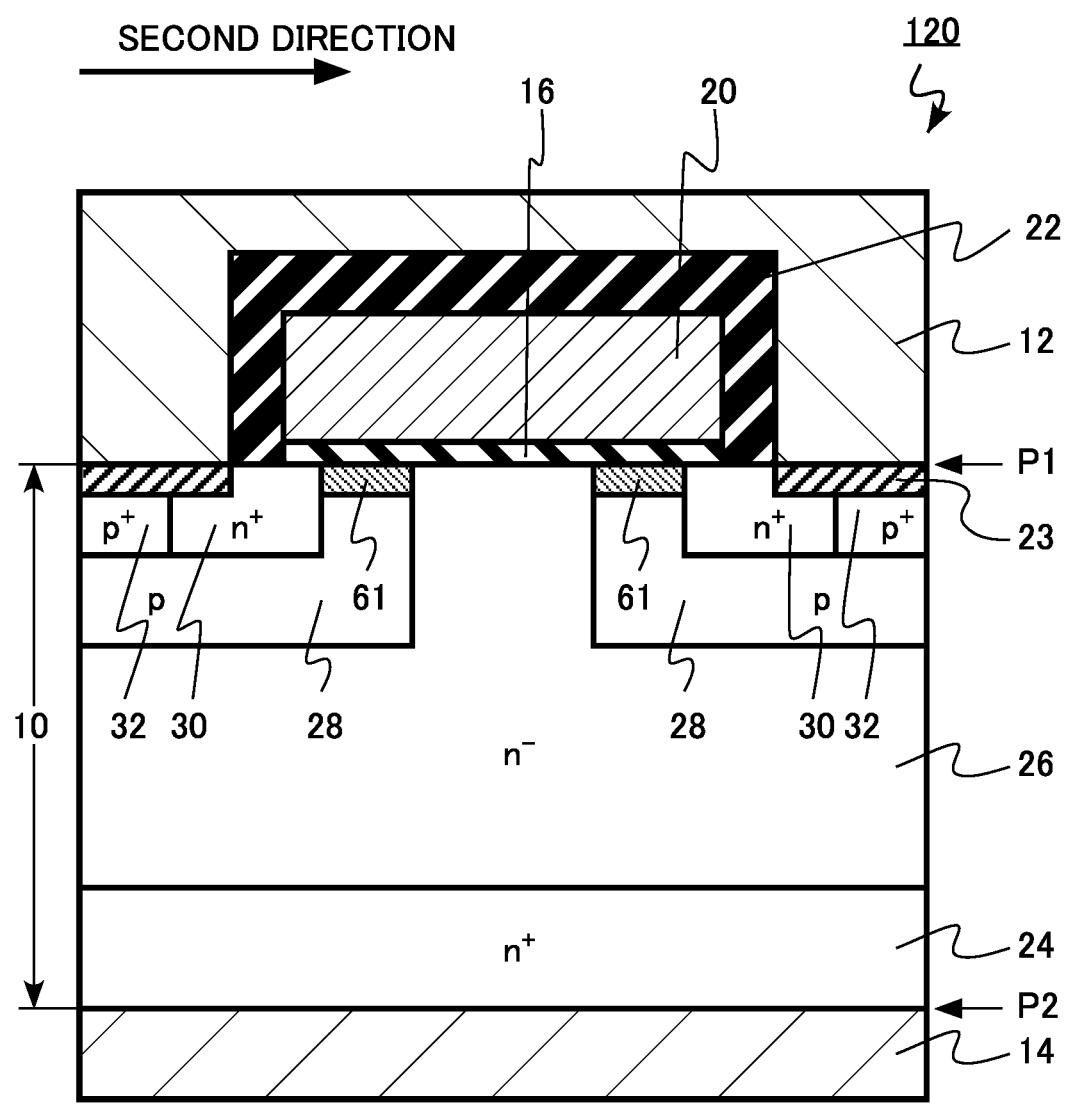
FIG. 19 is a schematic cross-sectional view of a semiconductor device according to a second modification of the first embodiment.

FIG. 19 is a schematic cross-sectional view of a semiconductor device according to a second modification of the first embodiment. A MOSFET 120 according to the second modification of the first embodiment differs from the MOSFET 100 according to the first embodiment in that the MOSFET 120 does not include a second oxygen region 62 (fifth silicon carbide region) and a third oxygen region 63 (sixth silicon carbide region).

The MOSFET 120 can be manufactured by, for example, selectively implanting oxygen only in a surface of the p-well region 28 when oxygen is ion-implanted in the silicon carbide layer 10. For example, by ion-implanting oxygen by using a mask material in which only a surface of a p-well region 28 is open, oxygen can be selectively implanted only in the surface of the p-well region 28.

As described above, with the semiconductor device according to the first embodiment and the modifications of the first embodiment, a MOSFET capable of achieving high threshold voltage is provided. In addition, a MOSFET capable of achieving high mobility is provided.

Second Embodiment

A semiconductor device according to a second embodiment differs from the semiconductor device according to the first embodiment in that, a silicon carbide layer and a gate insulating layer include at least one element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu), a distance from a second position to an interface between the gate insulating layer and the silicon carbide layer is 5 nm or less, and concentration of the at least one element is maximized in the second position. Hereinafter, a part of description of content overlapping content of the first embodiment will be omitted.

The semiconductor device according to the second embodiment is a MOSFET 200 of vertical and planar-gate-type. The MOSFET 200 is an n-channel transistor that uses an electron as a carrier. The MOSFET 200 has a structure as same as a structure of the MOSFET 100 according to the first embodiment except that the MOSFET 200 includes a termination element.

In the MOSFET 200, a silicon carbide layer 10 and a gate insulating layer 16 include at least one termination element (element) selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu). Hereinafter, a case where the termination element is nitrogen (N) will be described as an example.

Figure 20:
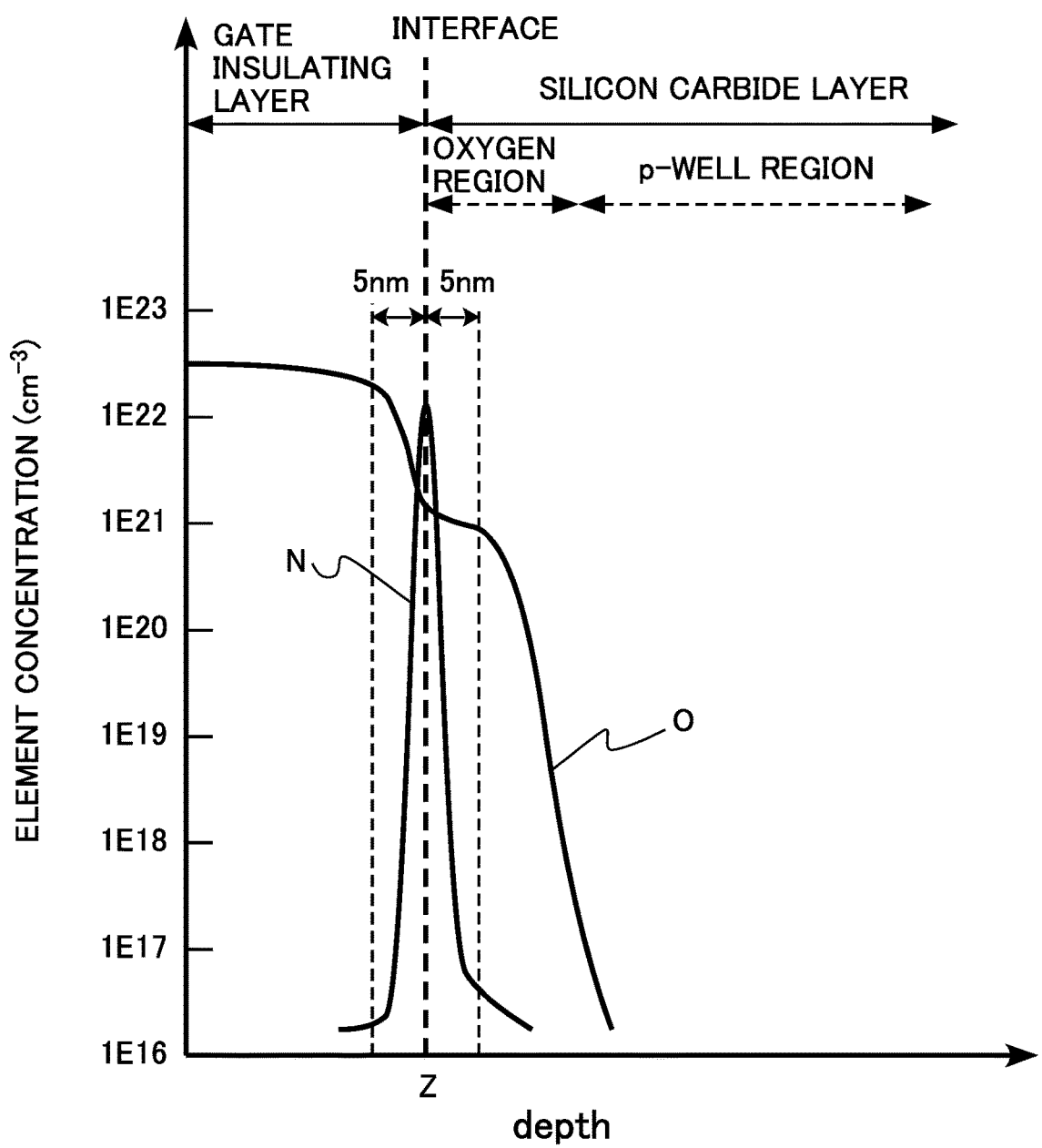
FIG. 20 is a diagram illustrating element concentration distribution of a semiconductor device according to a second embodiment.

FIG. 20 is a diagram illustrating element concentration distribution of the semiconductor device according to the second embodiment. FIG. 20 illustrates concentration distribution of oxygen and nitrogen as the termination element, in a depth direction. FIG. 20 illustrates concentration distribution of the elements in a portion including a gate insulating layer 16, a first oxygen region 61, and a p-well region 28.

A distance from a depth position Z where nitrogen concentration is maximum to an interface is 5 nm or less. In other words, the depth position Z is within a range of 5 nm or less from the interface. FIG. 20 illustrates a case where the depth position Z and the interface coincide with each other. The depth position Z is in the gate insulating layer 16 or the p-well region 28.

The distance from the depth position Z to the interface is preferably 2 nm or less, and more preferably 1 nm or less. A full width at half maximum with respect to a peak in concentration distribution of nitrogen is, for example, 1 nm or less. It is desirable that the full width at half maximum with respect to the peak in concentration distribution be, for example, 0.25 nm or less.

The termination element substitutes for a silicon atom or carbon atom of a bilayer (Si—C pair) constituting an uppermost layer of the first oxygen region 61. In a case of nitrogen, the nitrogen substitutes for a carbon atom of a bilayer constituting the uppermost layer. For example, any one of the above-described termination elements except for nitrogen, such as phosphorus (P), antimony (Sb), or lanthanum (La), substitutes for a silicon atom of the bilayer constituting the uppermost layer. A silicon atom or carbon atom left after the substitution with the termination element is emitted toward a gate insulating layer 16. The termination element is finally bonded to the silicon carbide layer 10 in tri-coordination.

For example, nitrogen is at a position of a carbon atom in a crystal structure of silicon carbide. A portion of silicon on an outermost surface is bonded to an atom on an insulating film side. Nitrogen is tri-coordinated with a silicon atom in the silicon carbide layer 10. Any one of the above-described termination elements except for nitrogen is at a position of a silicon atom in a crystal structure of silicon carbide. Any one of the above-described termination elements except for nitrogen is tri-coordinated with a carbon atom in the silicon carbide layer 10.

A peak value in concentration distribution of nitrogen is, for example, $4 \times 10^{19}$ cm$^{-3}$ or more and $4 \times 10^{23}$ cm$^{-3}$ or less.

From a viewpoint of reducing an interface state between the silicon carbide layer and the gate insulating layer, the peak value is preferably $1 \times 10^{21}$ cm$^{-3}$ or more, and further preferably $1 \times 10^{22}$ cm$^{-3}$ or more. Meanwhile, any excess nitrogen may cause charge trapping. Therefore, the peak value is preferably $1 \times 10^{23}$ cm$^{-3}$ or less. The peak value is preferably, for example, $5.0 \times 10^{22}$ cm$^{-3}$±5%. A peak value of $5.0 \times 10^{22}$ cm$^{-3}$±5% indicates a favorable characteristic with little charge trapping.

Area density of nitrogen at the interface is preferably $1 \times 10^{14}$ cm$^{-2}$ or more and $2.5 \times 10^{15}$ cm$^{-2}$ or less. Area density of nitrogen at the interface is preferably, for example, $1.4 \times 10^{15}$ cm$^{-2}$±5%. Area density $1.4 \times 10^{15}$ cm$^{-2}$±5% of nitrogen at the interface indicates a favorable characteristic with little charge trapping, especially in a case of the MOSFET 100.

The MOSFET 200 according to the second embodiment can be manufactured by adding, to the method for manufacturing the MOSFET 100 according to the first embodiment, heat treatment in atmosphere including nitrogen after forming the first oxygen region 61, for example.

One of factors of a decrease in mobility of an electron in a case where a MOSFET is formed by using silicon carbide is considered to be an interface state at an interface between a silicon carbide layer and a gate insulating layer. A decrease in mobility of an electron is considered to be due to an interface state, which causes trapping or scattering of electrons.

An interface state between the silicon carbide layer and the gate insulating layer is considered to be generated by a dangling bond of a silicon atom or carbon atom on an uppermost layer of the silicon carbide layer.

In the MOSFET 200 according to the second embodiment, the number of dangling bonds is decreased by nitrogen substituting for a carbon atom of a bilayer, which constitutes the uppermost layer, to be tri-coordinated. Therefore, an amount of an interface state between the silicon carbide layer 10 and the gate insulating layer 16 is reduced. As a result, the mobility of the MOSFET 200 is increased.

Diffusion of a termination element into a channel region causes a decrease in threshold voltage of the MOSFET. In the MOSFET 200 according to the second embodiment, a carbon vacancy in the silicon carbide layer 10 is filled with oxygen due to presence of the first oxygen region 61. Therefore, a carbon vacancy amount in the channel region is reduced. Therefore, diffusion of the termination element into the channel region is suppressed, and a decrease in threshold voltage of the MOSFET 200 is suppressed. From the above-described point as well, high threshold voltage can be achieved for the MOSFET 200.

As described above, according to the second embodiment, a MOSFET capable of achieving high threshold voltage is provided, as similar to the case of the first embodiment. In addition, a MOSFET capable of achieving further high mobility is provided.

Third Embodiment

A semiconductor device according to a third embodiment includes a gate electrode; a gate insulating layer; and a silicon carbide layer having a first plane and a second plane facing the first plane, the silicon carbide layer including a first silicon carbide region of n-type and a second silicon carbide region positioned between the first silicon carbide region and the gate insulating layer, and the second silicon carbide region including at least one oxygen atom bonded to four silicon atoms. The semiconductor device according to the third embodiment differs from the semiconductor device according to the first embodiment in that, the silicon carbide layer does not include a region corresponding to the second silicon carbide region and sixth silicon carbide region in the first embodiment. Hereinafter, a part of description of content overlapping content of the first embodiment will be omitted.

Figure 21:
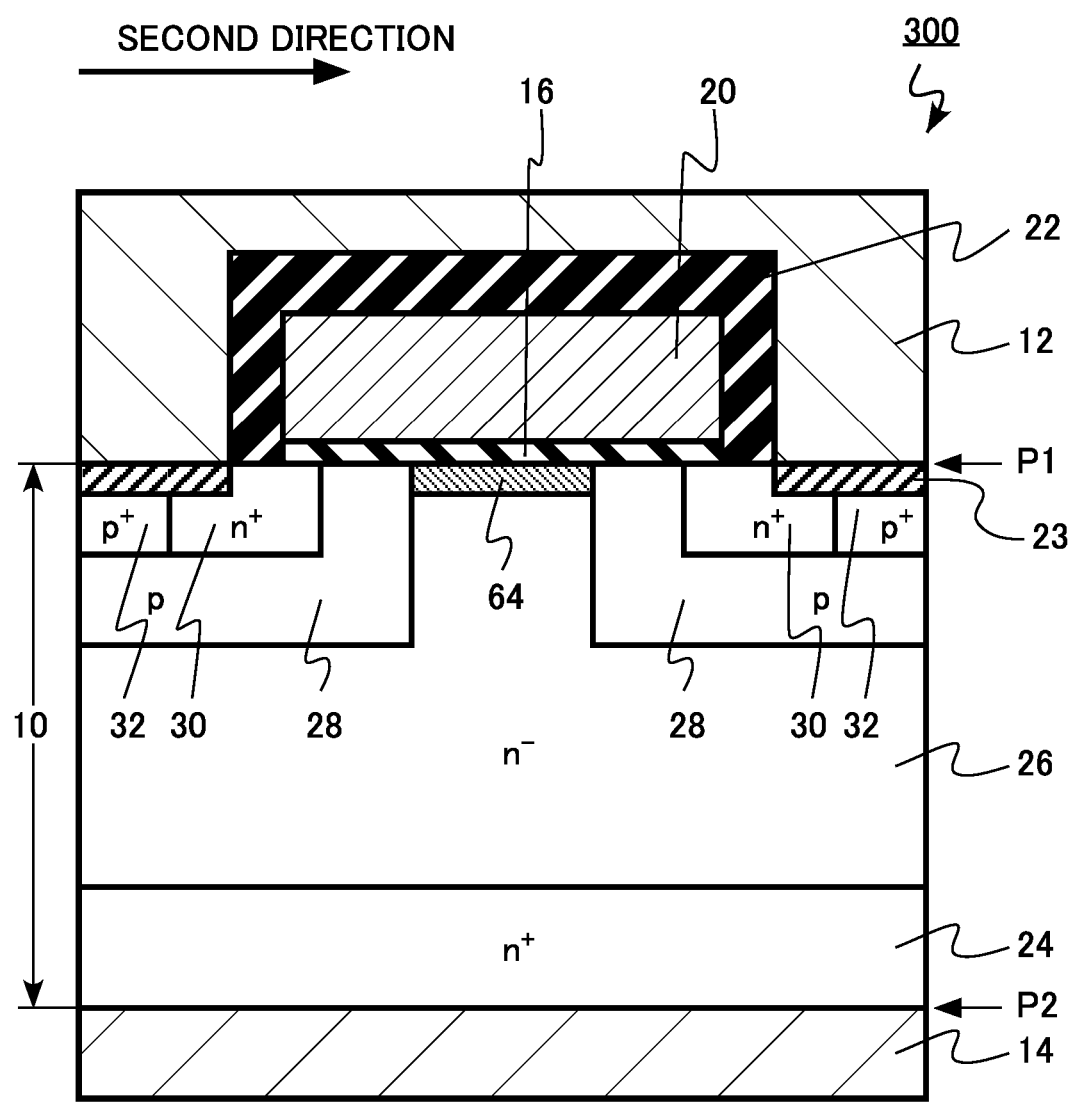
FIG. 21 is a schematic cross-sectional view of a semiconductor device according to a third embodiment.

FIG. 21 is a schematic cross-sectional view of the semiconductor device according to the third embodiment. The semiconductor device according to the third embodiment is a MOSFET 300 of vertical and planar-gate-type. The MOSFET 300 is an n-channel transistor that uses an electron as a carrier.

The MOSFET 300 includes a silicon carbide layer 10, a source electrode 12 (first electrode), a drain electrode 14 (second electrode), a gate insulating layer 16, a gate electrode 20, an interlayer insulating layer 22, and a metal silicide layer 23.

In the silicon carbide layer 10, there are a drain region 24, a drift region 26 (first silicon carbide region), a p-well region 28, a source region 30, a p-well contact region 32, an oxygen region 64 (second silicon carbide region). The oxygen region 64 (second silicon carbide region) corresponds to the second oxygen region 62 of the MOSFET 100 according to the first embodiment.

The oxygen region 64 is SiC of $n^-$-type. The oxygen region 64 is positioned between the drift region 26 and a first plane P1. A portion of the oxygen region 64 is in contact with the first plane P1.

The oxygen region 64 is provided between the drift region 26 and the gate electrode 20. The oxygen region 64 is provided between the drift region 26 and the gate insulating layer 16. A portion of the oxygen region 64 is in contact with the gate insulating layer 16.

The oxygen region 64 includes, for example, nitrogen (N) as an n-type impurity. The n-type impurity concentration in the oxygen region 64 is, for example, $1\times10^{15}$ cm$^{-3}$ or more and $2\times10^{16}$ cm$^{-3}$ or less.

The oxygen region 64 includes oxygen. Oxygen concentration in the oxygen region 64 is, for example, $1\times10^{17}$ cm$^{-3}$ or more and $1\times10^{23}$ cm$^{-3}$ or less. Maximum oxygen concentration in the oxygen region 64 is, for example, $1\times10^{17}$ cm$^{-3}$ or more and $1\times10^{23}$ cm$^{-3}$ or less.

The oxygen concentration in the oxygen region 64 is higher than oxygen concentration in the drift region 26, for example. The oxygen concentration in the oxygen region 64 is higher than maximum oxygen concentration in the drift region 26, for example.

The oxygen concentration in the oxygen region 64 is higher than nitrogen concentration in the drift region 26, for example. The maximum oxygen concentration in the oxygen region 64 is higher than maximum nitrogen concentration in the oxygen region 64, for example.

In the MOSFET 300 according to the third embodiment, the oxygen region 64 is provided between the gate insulating layer 16 and the drift region 26. By having the oxygen region 64, the gate insulating layer 16 of the MOSFET 300 has thicker effective film. Therefore, field strength applied to the gate insulating layer 16 decreases. Therefore, dielectric breakdown tolerance of the gate insulating layer 16 is improved, and reliability of the gate insulating layer 16 is increased. In addition, leakage current of the gate insulating layer 16 is reduced.

As described above, according to the third embodiment, a MOSFET having increased reliability of the gate insulating layer 16 and reduced leakage current of the gate insulating layer 16 is provided.

Fourth Embodiment

A semiconductor device according to the fourth embodiment differs from the semiconductor device according to the first embodiment in that the semiconductor device according to the fourth embodiment includes a Schottky barrier diode (SBD). Hereinafter, a part of description of content overlapping content of the first embodiment will be omitted.

Figure 22:
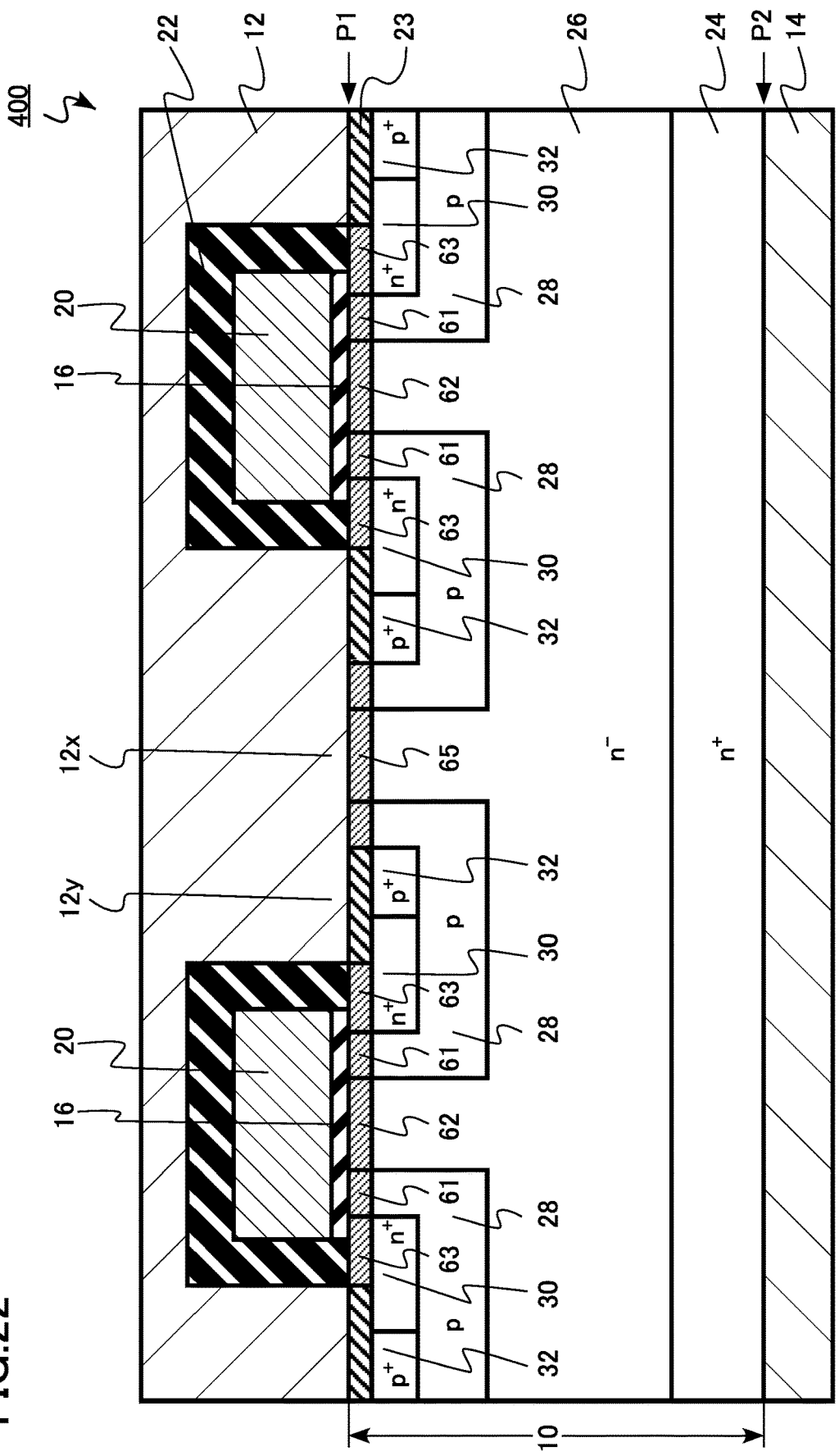
FIG. 22 is a schematic cross-sectional view of a semiconductor device according to a fourth embodiment.

FIG. 22 is a schematic cross-sectional view of the semiconductor device according to the fourth embodiment. The semiconductor device according to the fourth embodiment is a MOSFET 400 of vertical and planar-gate-type. The MOSFET 400 is an n-channel transistor that uses an electron as a carrier.

The MOSFET 400 includes an SBD as a built-in diode. The MOSFET 400 has a structure similar to a structure of the MOSFET 100 according to the first embodiment except that the MOSFET 400 includes an SBD.

The MOSFET 400 includes a silicon carbide layer 10, a source electrode 12 (first electrode), a drain electrode 14 (second electrode), a gate insulating layer 16, a gate electrode 20, an interlayer insulating layer 22, and a metal silicide layer 23. The source electrode 12 includes an anode part 12x and a contact part 12y.

In the silicon carbide layer 10, there are a drain region 24, a drift region 26, a p-well region 28, a source region 30, a p-well contact region 32, a first oxygen region 61, a second oxygen region 62, a third oxygen region 63, and a fourth oxygen region 65.

The fourth oxygen region 65 is SiC of $n^-$-type. The fourth oxygen region 65 is positioned between the drift region 26 and a first plane P1. A portion of the fourth oxygen region 65 is in contact with the first plane P1. The fourth oxygen region 65 is sandwiched between two p-well regions 28.

The fourth oxygen region 65 is positioned between the drift region 26 and the anode part 12x. A portion of the fourth oxygen region 65 is in contact with the anode part 12x.

The fourth oxygen region 65 includes, for example, nitrogen (N) as an n-type impurity. The n-type impurity concentration in the fourth oxygen region 65 is, for example, $1\times10^{15}$ cm$^{-3}$ or more and $2\times10^{16}$ cm$^{-3}$ or less. Maximum n-type impurity concentration in the fourth oxygen region 65 is, for example, $1\times10^{15}$ cm$^{-3}$ or more and $2\times10^{16}$ cm$^{-3}$ or less.

The fourth oxygen region 65 includes oxygen. Oxygen concentration in the fourth oxygen region 65 is, for example, $1\times10^{17}$ cm$^{-3}$ or more and $1\times10^{23}$ cm$^{-3}$ or less. Maximum oxygen concentration in the fourth oxygen region 65 is, for example, $1\times10^{17}$ cm$^{-3}$ or more and $1\times10^{23}$ cm$^{-3}$ or less.

The oxygen concentration in the fourth oxygen region 65 is higher than oxygen concentration in the drift region 26, for example. The oxygen concentration in the fourth oxygen region 65 is higher than maximum oxygen concentration in the drift region 26, for example.

The oxygen concentration in the fourth oxygen region 65 is higher than nitrogen concentration in the fourth oxygen region 65, for example. The maximum oxygen concentration in the fourth oxygen region 65 is higher than maximum nitrogen concentration in the fourth oxygen region 65, for example.

The fourth oxygen region 65 includes an oxygen atom bonded to four silicon atoms. In other words, in the fourth oxygen region 65, there is one oxygen atom positioned at the carbon site of the crystal structure of the silicon carbide. In other words, the fourth oxygen region 65 has a structure in which one oxygen atom substitutes for a carbon atom of a crystal structure of silicon carbide.

The fourth oxygen region 65 can be formed at the same time as the first oxygen region 61, the second oxygen region 62, and the third oxygen region 63 are formed.

The source electrode 12 has an anode part 12x and a contact part 12y. The anode part 12x is in contact with the fourth oxygen region 65. The contact part 12y is in contact with the source region 30 and the p-well contact region 32.

Figure 23:
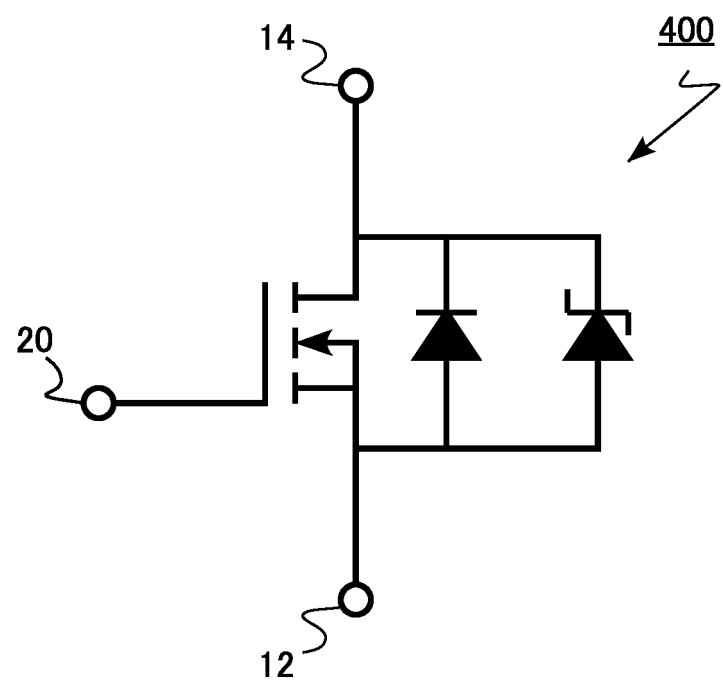
FIG. 23 is an equivalent circuit diagram of the semiconductor device according to the fourth embodiment.

FIG. 23 is an equivalent circuit diagram of the semiconductor device according to the fourth embodiment. A p-n junction diode and an SBD are connected as a built-in diode between the source electrode 12 and the drain electrode 14 in parallel with a transistor having the gate electrode 20. The source electrode 12 is an anode of the p-n junction diode and the drain electrode 14 is a cathode of the p-n junction diode. Further, the source electrode 12 is an anode of the SBD, and the drain electrode 14 is a cathode of the SBD.

The anode part 12x of the source electrode 12, the fourth oxygen region 65, the drift region 26, the drain region 24, and the drain electrode 14 constitute the SBD.

For example, a case where the MOSFET 400 is used as a switching device connected to inductive load is considered. When the MOSFET 400 is off, voltage with which the source electrode 12 is positive relative to the drain electrode 14 may be applied due to load current caused by the inductive load. In this case, forward current flows through the built-in diode. The above-described state is referred to as a reverse conduction state.

Forward voltage (Vf) at which forward current starts to flow in the SBD is lower than forward voltage (Vf) of the p-n junction diode. Therefore, first, forward current flows through the SBD.

Forward voltage (Vf) of the SBD is, for example, 0.8 V. Forward voltage (Vf) of the p-n junction diode is, for example, 2.5 V.

The SBD performs unipolar operation. Therefore, even if forward current flows, a stacking defect does not grow in the silicon carbide layer 10 due to recombination energy of a carrier. Therefore, fluctuation of on-resistance due to stacking defect growth does not occur.

The SBD of the MOSFET 400 includes the fourth oxygen region 65. The fourth oxygen region 65 includes an oxygen atom bonded to four silicon atoms. Therefore, it is possible to reduce variation in height of a Schottky barrier.

The fourth oxygen region 65 includes an oxygen atom bonded to four silicon atoms, by which a localized state is formed on a lower end side of a conduction band. The localized state is formed at a position of about 0.8 eV from the lower end of the conduction band. Difference in energy between the localized state and the lower end of the conduction band is, for example, 0.7 eV or more and 1.0 eV or less.

If there is a localized state in the fourth oxygen region 65, an electron moves between the anode part 12x in contact with the fourth oxygen region 65 and the localized state. The movement of electron fixes height of the Schottky barrier between the anode part 12x and the fourth oxygen region 65 to about 0.8 eV. So-called Fermi-level pinning occurs. Occurrence of Fermi-level pinning fixes height of a Schottky barrier between the anode part 12x and the fourth oxygen region 65 to about 0.8 eV.

By fixing the height of the Schottky barrier to about 0.8 eV, variation in height of the Schottky barrier of the SBD is reduced.

Formation of a localized state in a band gap and occurrence of Fermi-level pinning fix height of the Schottky barrier to about 0.8 eV independent of a material of the anode part 12x. Therefore, a material of the anode part 12x can be arbitrarily selected.

From a viewpoint of forming a sufficient amount of localized state in the fourth oxygen region 65 and stably fixing height of the Schottky barrier, maximum oxygen concentration in the fourth oxygen region 65 is preferably $1 \times 10^{17}$ cm$^{-3}$ or more, more preferably $2 \times 10^{18}$ cm$^{-3}$ or more, further preferably $3 \times 10^{19}$ cm$^{-3}$ or more, further preferably $3 \times 10^{20}$ cm$^{-3}$ or more, and further preferably $3 \times 10^{21}$ cm$^{-3}$ or more.

As described above, with the semiconductor device according to the fourth embodiment, a MOSFET capable of achieving high threshold voltage is provided, as similar to the case of the first embodiment. In addition, a MOSFET capable of achieving high mobility is provided. Further, a MOSFET capable of increasing reliability is provided. The MOSFET includes an SBD as a built-in diode.

Fifth Embodiment

A semiconductor device according to a fifth embodiment differs from the semiconductor device according to the first embodiment in that, a silicon carbide layer has a trench, and a gate electrode is positioned in the trench. Hereinafter, a part of description of content overlapping content of the first embodiment will be omitted.

Figure 24:
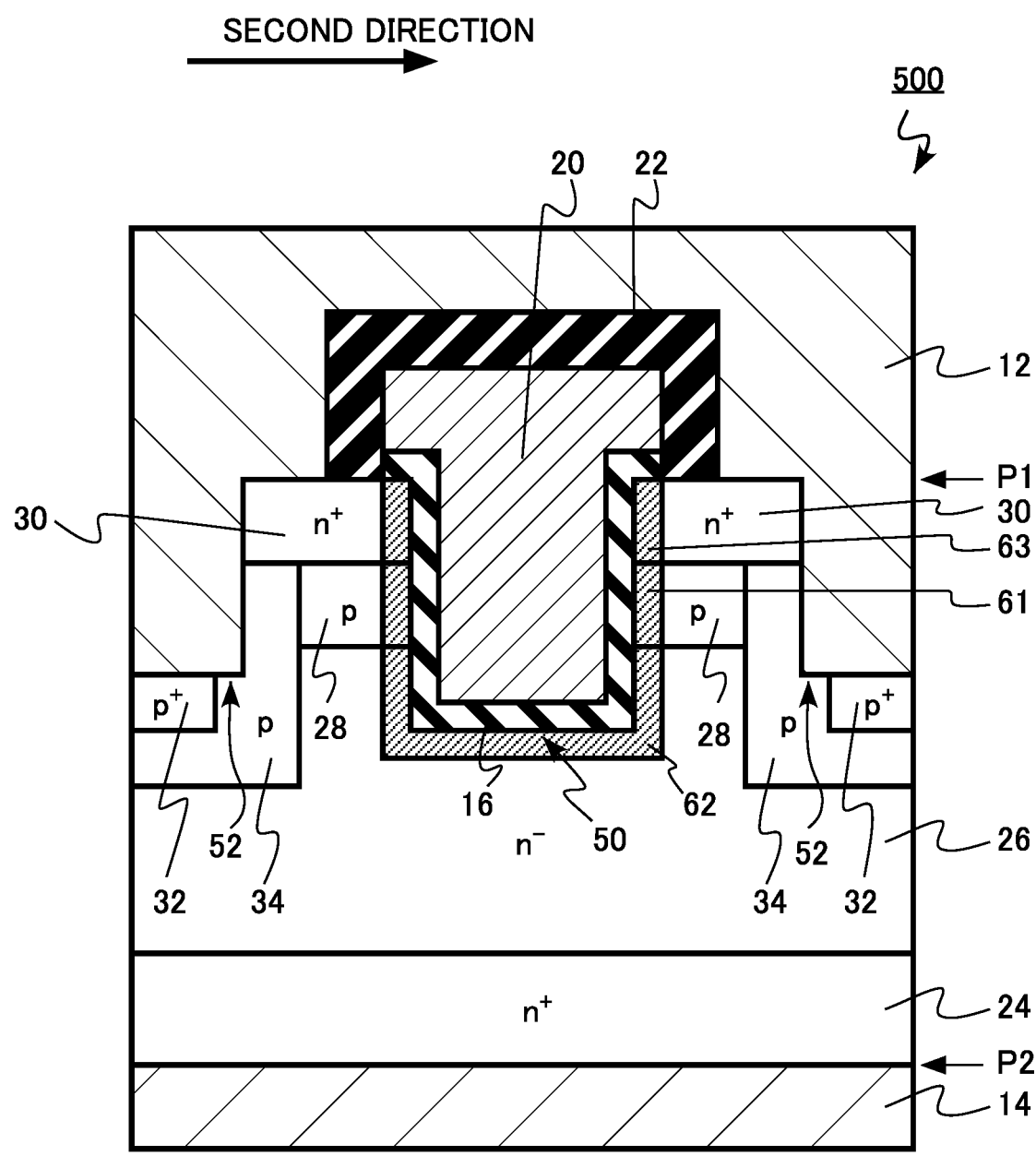
FIG. 24 is a schematic cross-sectional view of a semiconductor device according to a fifth embodiment.

FIG. 24 is a schematic cross-sectional view of the semiconductor device according to the fifth embodiment. The semiconductor device according to the fifth embodiment is a MOSFET 500 of vertical and trench-gate type having a gate electrode in a trench. The MOSFET 500 is an n-channel transistor that uses an electron as a carrier.

The MOSFET 500 includes a silicon carbide layer 10, a source electrode 12 (first electrode), a drain electrode 14 (second electrode), a gate insulating layer 16, a gate electrode 20, an interlayer insulating layer 22, a first trench 50, and a second trench 52.

In the silicon carbide layer 10, there are a drain region 24, a drift region 26 (third silicon carbide region), a p-well region 28 (first silicon carbide region), a source region 30 (fourth silicon carbide region), a p-well contact region 32, an electric field relaxation region 34, a first oxygen region 61 (second silicon carbide region), a second oxygen region 62 (fifth silicon carbide region), a third oxygen region 63 (sixth silicon carbide region).

The silicon carbide layer 10 includes the first trench 50 and the second trench 52. The first trench 50 is interposed between two second trenches 52. The first trench 50 and the second trench 52 are grooves formed in the silicon carbide layer 10.

The first trench 50 penetrates the p-well region 28 and reaches the drift region 26. A bottom face of the first trench 50 is positioned in the drift region 26.

The gate electrode 20 is positioned in the first trench 50.

The gate insulating layer 16 is positioned in the first trench 50. The gate insulating layer 16 is positioned between the gate electrode 20 and the silicon carbide layer 10. The p-well region 28 near the gate insulating layer 16 is the channel region of the MOSFET 500.

A face of the silicon carbide layer 10, which is in contact with the gate insulating layer 16, is an m-face, for example.

A portion of the source electrode 12 is positioned in the second trench 52. The p-well contact region 32 is positioned at a bottom of the second trench 52.

The electric field relaxation region 34 is SiC of p-type. The electric field relaxation region 34 is positioned around the second trench 52.

The electric field relaxation region 34 includes, for example, aluminum (Al) as a p-type impurity. P-type impurity concentration in the electric field relaxation region 34 is, for example, $1 \times 10^{16}$ cm$^{-3}$ or more and $1 \times 10^{20}$ cm$^{-3}$ or less.

When the MOSFET 500 is off, a depletion layer extends from the electric field relaxation region 34 to the drift region 26. The depletion layer extending to the drift region 26 relaxes field strength applied to the gate insulating layer 16 at a bottom of the first trench 50. Therefore, withstand voltage of the gate insulating layer 16 is increased.

The first oxygen region 61 is provided between the p-well region 28 and the gate electrode 20. The first oxygen region 61 is provided between the p-well region 28 and the gate insulating layer 16. A portion of the first oxygen region 61 is in contact with the gate insulating layer 16.

The second oxygen region 62 is provided between the drift region 26 and the gate electrode 20. The second oxygen region 62 is provided between the drift region 26 and the gate insulating layer 16. A portion of the second oxygen region 62 is in contact with the gate insulating layer 16.

The third oxygen region 63 is provided between the source region 30 and the gate electrode 20. The third oxygen region 63 is provided between the source region 30 and the gate insulating layer 16. A portion of the third oxygen region 63 is in contact with the gate insulating layer 16.

The first oxygen region 61, the second oxygen region 62, and the third oxygen region 63 are formed by, for example, ion-implanting oxygen, silicon, and carbon from a side face and bottom face of the first trench 50 in the silicon carbide layer 10 by using the tilted angle ion implantation method with a plurality of angles, after forming the first trench 50. According to an ion implantation pattern illustrated in FIG. 11, ion co-implantation is performed such that distribution of silicon covers distribution of oxygen. In addition, the co-implantation is performed such that distribution of carbon is deeper than the distribution of oxygen.

In the MOSFET 500 according to the fifth embodiment, the first oxygen region 61 is provided between the gate insulating layer 16 and the p-well region 28. By having the first oxygen region 61, high threshold voltage and high mobility are achieved in the MOSFET 500.

In the MOSFET 500 according to the fifth embodiment, the second oxygen region 62 is provided between the gate insulating layer 16 and the drift region 26. In the MOSFET 500 according to the fifth embodiment, the third oxygen region 63 is provided between the gate insulating layer 16 and the source region 30. By having the second oxygen region 62 and the third oxygen region 63, the effective thickness of the gate insulating layer 16 in the MOSFET 500 becomes thicker. Therefore, reliability of the gate insulating layer 16 is increased. In addition, leakage current of the gate insulating layer 16 is reduced.

As described above, according to the fifth embodiment, a MOSFET capable of achieving high threshold voltage is provided, as similar to the case of the first embodiment. In addition, a MOSFET capable of achieving high mobility is provided. Further, by adopting a trench-gate type, channel density is increased. Thus, a MOSFET in which on-resistance is reduced is provided.

Sixth Embodiment

A semiconductor device according to a sixth embodiment includes a gate electrode, a gate insulating layer, and a silicon carbide layer having a first plane and a second plane facing the first plane, the silicon carbide layer including a first silicon carbide region of n-type and a second silicon carbide region that is positioned between the first silicon carbide region and the gate insulating layer and includes an oxygen atom bonded to four silicon atoms. The silicon carbide layer further includes a trench disposed on a side of the first plane, the trench having a first side face, a second side face, and a bottom face between the first side face and the second side face, and the second silicon carbide region is positioned between the first silicon carbide region and the bottom face. The semiconductor device according to the sixth embodiment differs from the semiconductor device according to the fifth embodiment in that, the silicon carbide layer does not include a region corresponding to the second silicon carbide region and sixth silicon carbide region in the fifth embodiment. Hereinafter, a part of description of content overlapping content of the fifth embodiment will be omitted.

Figure 25:
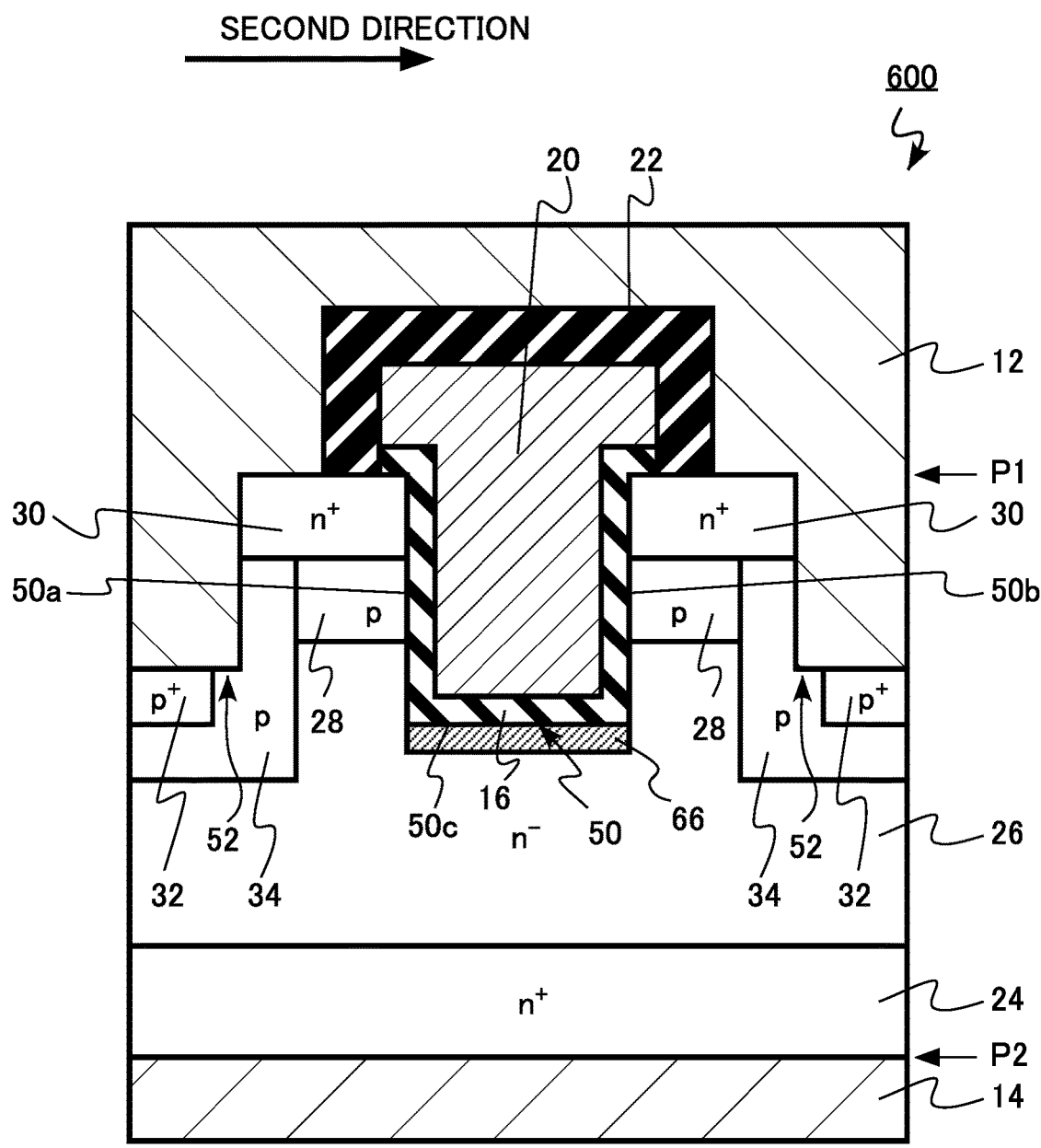
FIG. 25 is a schematic cross-sectional view of a semiconductor device according to a sixth embodiment.

FIG. 25 is a schematic cross-sectional view of the semiconductor device according to the sixth embodiment. The semiconductor device according to the sixth embodiment is a MOSFET 600 of vertical and trench-gate type having a gate electrode in a trench. The MOSFET 600 is an n-channel transistor that uses an electron as a carrier.

The MOSFET 600 includes a silicon carbide layer 10, a source electrode 12 (first electrode), a drain electrode 14 (second electrode), a gate insulating layer 16, a gate electrode 20, an interlayer insulating layer 22, a first trench 50 (trench), and a second trench 52. The first trench 50 has a first side face 50a, a second side face 50b, and a bottom face 50c. The bottom face 50c is positioned between the first side face 50a and the second side face 50b.

In the silicon carbide layer 10, there are a drain region 24, a drift region 26 (third silicon carbide region), a p-well region 28 (first silicon carbide region), a source region 30 (fourth silicon carbide region), a p-well contact region 32, an electric field relaxation region 34, and a bottom oxygen region 66 (second silicon carbide region).

The bottom oxygen region 66 is SiC of n$^-$-type. The bottom oxygen region 66 is positioned between the drift region 26 and the bottom face 50c of the first trench 50. A portion of the bottom oxygen region 66 is in contact with a first plane P1.

The bottom oxygen region 66 is provided between the drift region 26 and the gate electrode 20. The bottom oxygen region 66 is provided between the drift region 26 and the gate insulating layer 16. A portion of the bottom oxygen region 66 is in contact with the gate insulating layer 16.

The bottom oxygen region 66 includes, for example, nitrogen (N) as an n-type impurity. The n-type impurity concentration in the bottom oxygen region 66 is, for example, $1 \times 10^{15}$ cm$^{-3}$ or more and $2 \times 10^{16}$ cm$^{-3}$ or less.

The bottom oxygen region 66 includes oxygen. Oxygen concentration in the bottom oxygen region 66 is, for example, $1 \times 10^{17}$ cm$^{-3}$ or more and $1 \times 10^{23}$ cm$^{-3}$ or less. Maximum oxygen concentration in the bottom oxygen region 66 is, for example, $1 \times 10^{17}$ cm$^{-3}$ or more and $1 \times 10^{23}$ cm$^{-3}$ or less.

The oxygen concentration in the bottom oxygen region 66 is higher than oxygen concentration in the drift region 26, for example. The oxygen concentration in the bottom oxygen region 66 is higher than maximum oxygen concentration in the drift region 26, for example.

The oxygen concentration in the bottom oxygen region 66 is higher than nitrogen concentration in the drift region 26, for example. The maximum oxygen concentration in the bottom oxygen region 66 is higher than maximum nitrogen concentration in the bottom oxygen region 66, for example.

The bottom oxygen region 66 includes an oxygen atom bonded to four silicon atoms. The bottom oxygen region 66 includes a first structure in which one oxygen atom substitutes for a carbon atom of a crystal structure of silicon carbide.

Density of the oxygen atom bonded to four silicon atoms in the bottom oxygen region 66 is higher than density of an oxygen atom bonded to two silicon atoms in the bottom oxygen region 66, for example. In other words, density of the first structure of the bottom oxygen region 66 is higher than density of a second structure of the bottom oxygen region 66, for example.

Density of the oxygen atom bonded to four silicon atoms in the bottom oxygen region 66 is higher than density of the oxygen atom bonded to a carbon atom in the bottom oxygen region 66, for example. In other words, density of the first structure of the bottom oxygen region 66 is higher than density of the third structure of the bottom oxygen region 66, for example.

The bottom oxygen region 66 can be formed by, for example, forming the first trench 50 and then ion-implanting oxygen, silicon, and carbon in the silicon carbide layer 10 from a direction perpendicular to a bottom face of the first trench 50. According to an ion implantation pattern illustrated in FIG. 11, ion co-implantation is performed such that distribution of silicon covers distribution of oxygen. In addition, the co-implantation is performed such that distribution of carbon is deeper than the distribution of oxygen.

In the MOSFET 600 according to the sixth embodiment, the bottom oxygen region 66 is provided between the gate insulating layer 16 at the bottom of the first trench 50 and the drift region 26. By having the bottom oxygen region 66, the effective thickness of the gate insulating layer 16 at the bottom of the first trench 50 in the MOSFET 600 becomes thicker. Therefore, reliability of the gate insulating layer 16 is increased. In addition, leakage current of the gate insulating layer 16 is reduced.

Oxygen concentration in the bottom oxygen region 66 is preferably $1 \times 10^{17}$ cm$^{-3}$ or more, more preferably $2 \times 10^{18}$ cm$^{-3}$ or more, further preferably $3 \times 10^{19}$ cm$^{-3}$ or more, further preferably $3 \times 10^{20}$ cm$^{-3}$ or more, and further preferably $3 \times 10^{21}$ cm$^{-3}$ or more. By the above-described lower limit values being exceeded, the effective thickness of the gate insulating layer 16 becomes thicker, reliability of the gate insulating layer 16 of the MOSFET 600 is further increased, and leakage current of the gate insulating layer 16 is further reduced.

As described above, according to the sixth embodiment, a MOSFET having increased reliability of a gate insulating layer 16 and reduced leakage current of a gate insulating layer 16 is provided.

Seventh Embodiment

An inverter circuit and drive according to a seventh embodiment are a drive including the semiconductor device according to the first embodiment.

Figure 26:
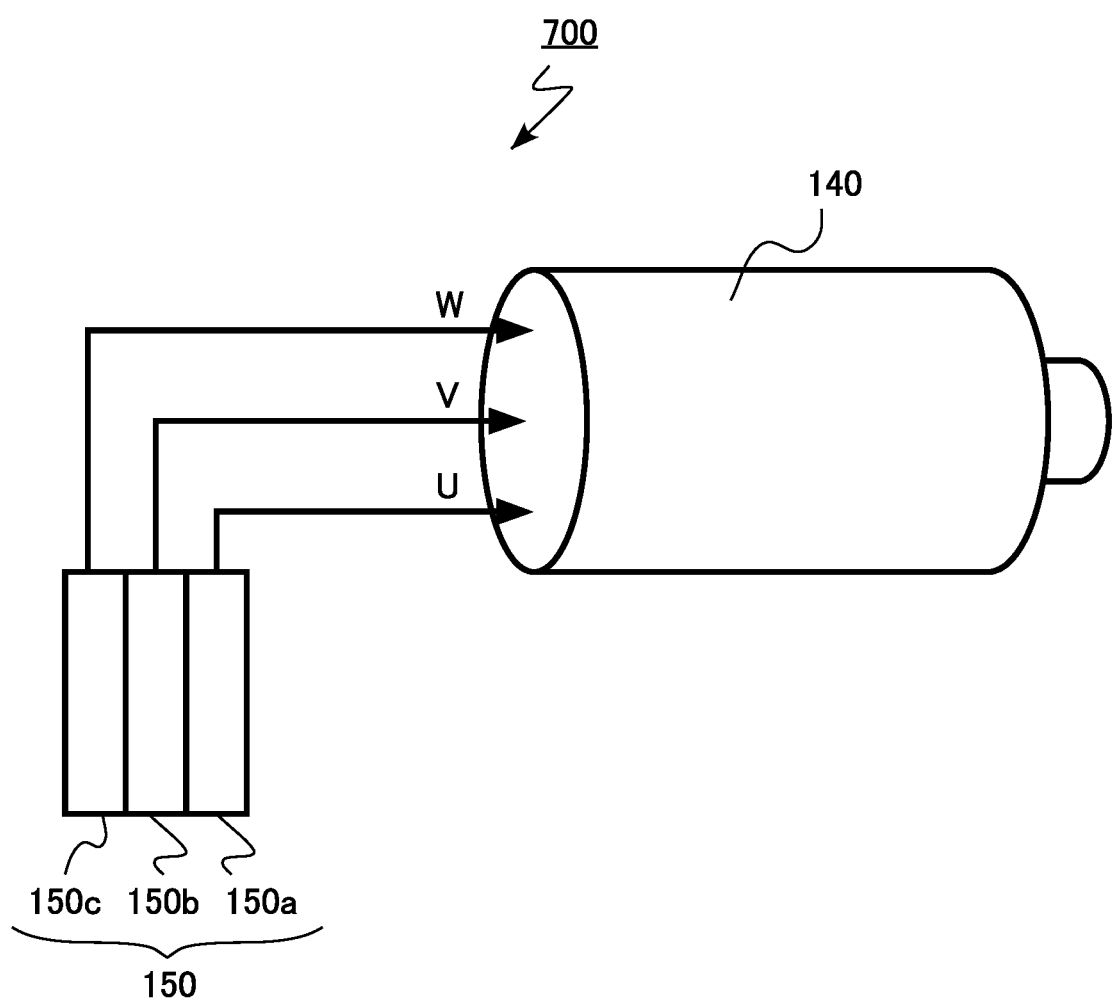
FIG. 26 is a schematic diagram of a drive according to a seventh embodiment.

FIG. 26 is a schematic diagram of the drive according to the seventh embodiment. A drive 700 includes a motor 140 and an inverter circuit 150.

The inverter circuit 150 includes three semiconductor modules 150a, 150b, and 150c having the MOSFET 100 according to the first embodiment as a switching device. By connecting the three semiconductor modules 150a, 150b, and 150c in parallel, an inverter circuit 150 of three-phases including three alternating-current voltage output terminals U, V, and W is implemented. The motor 140 is driven by alternating-current voltage output from the inverter circuit 150.

According to the seventh embodiment, characteristics of the inverter circuit 150 and drive 700 are improved by including the MOSFET 100 with an improved characteristic.

Eighth Embodiment

A vehicle according to an eighth embodiment is a vehicle including the semiconductor device according to the first embodiment.

Figure 27:
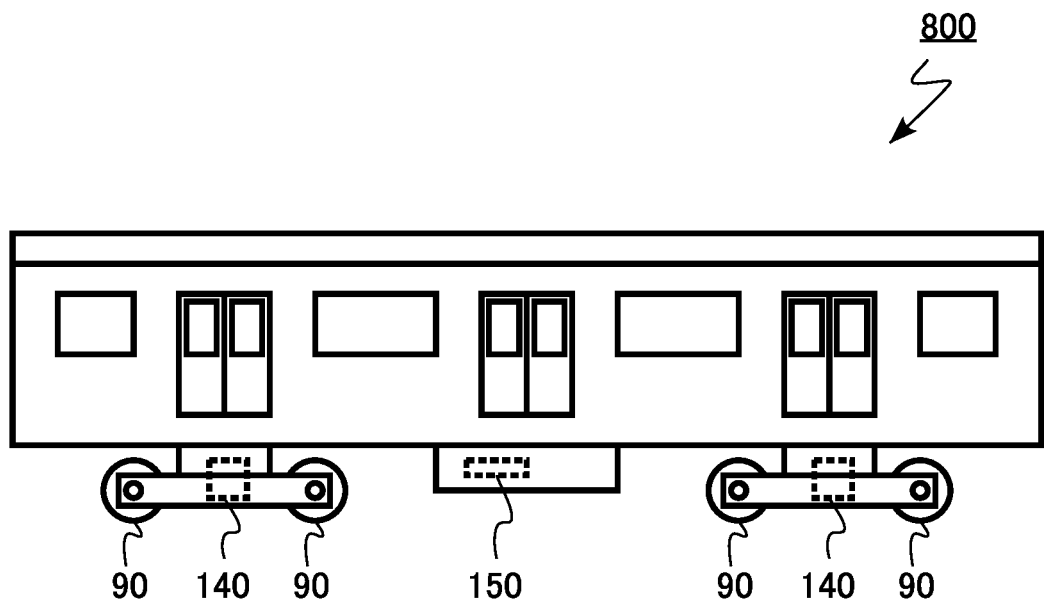
FIG. 27 is a schematic diagram of a vehicle according to an eighth embodiment.

FIG. 27 is a schematic diagram of the vehicle according to the eighth embodiment. A vehicle 800 according to the eighth embodiment is a railroad vehicle. The vehicle 800 includes a motor 140 and an inverter circuit 150.

The inverter circuit 150 includes three semiconductor modules having the MOSFET 100 according to the first embodiment as a switching device. By connecting the three semiconductor modules in parallel, an inverter circuit 150 of three-phases including three alternating-current voltage output terminals U, V, and W is implemented. The motor 140 is driven by alternating-current voltage output from the inverter circuit 150. The motor 140 rotates wheels 90 of the vehicle 800.

According to the eighth embodiment, a characteristic of the vehicle 800 is improved by including the MOSFET 100 with an improved characteristic.

Ninth Embodiment

A vehicle according to a ninth embodiment is a vehicle including the semiconductor device according to the first embodiment.

Figure 28:
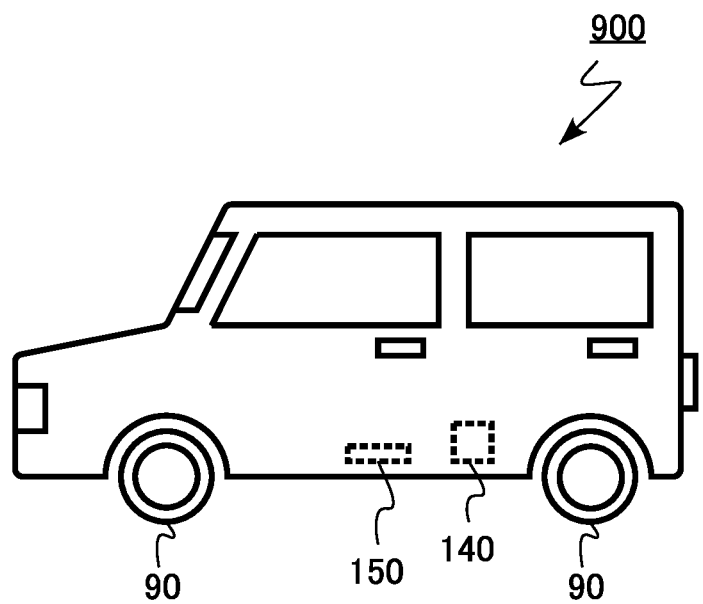
FIG. 28 is a schematic diagram of a vehicle according to a ninth embodiment.

FIG. 28 is a schematic diagram of the vehicle according to the ninth embodiment. A vehicle 900 according to the ninth embodiment is an automobile. The vehicle 900 includes a motor 140 and an inverter circuit 150.

The inverter circuit 150 includes three semiconductor modules having the MOSFET 100 according to the first embodiment as a switching device. By connecting the three semiconductor modules in parallel, an inverter circuit 150 of three-phases including three alternating-current voltage output terminals U, V, and W is implemented.

The motor 140 is driven by alternating-current voltage output from the inverter circuit 150. The motor 140 rotates wheels 90 of the vehicle 900.

According to the ninth embodiment, a characteristic of the vehicle 900 is improved by including the MOSFET 100 with an improved characteristic.

Tenth Embodiment

An elevator according to a tenth embodiment is an elevator including the semiconductor device according to the first embodiment.

Figure 29:
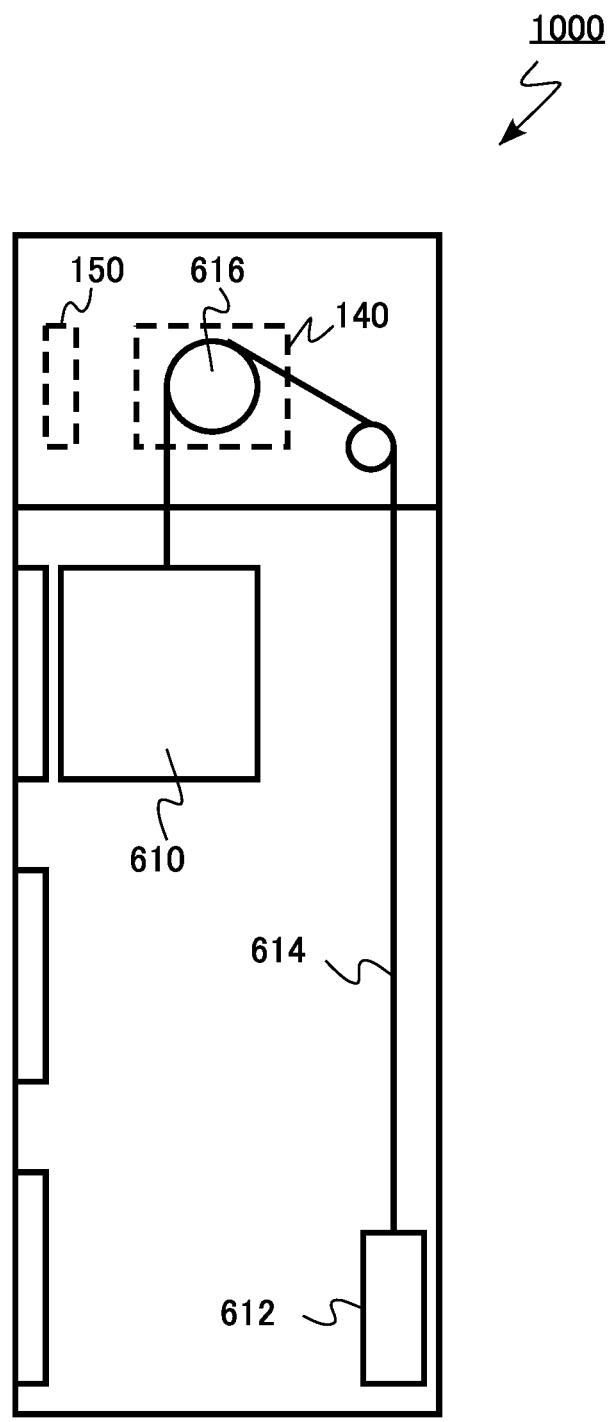
FIG. 29 is a schematic diagram of an elevator according to a tenth embodiment.

FIG. 29 is a schematic diagram of the elevator according to the tenth embodiment. An elevator 1000 according to the tenth embodiment includes a cage 610, a counterweight 612, a wire rope 614, a winding machine 616, a motor 140, and an inverter circuit 150.

The inverter circuit 150 includes three semiconductor modules having the MOSFET 100 according to the first embodiment as a switching device. By connecting the three semiconductor modules in parallel, an inverter circuit 150 of three-phases including three alternating-current voltage output terminals U, V, and W is implemented.

The motor 140 is driven by alternating-current voltage output from the inverter circuit 150. The motor 140 rotates the winding machine 616, and the cage 610 moves up and down.

According to the tenth embodiment, a characteristic of the elevator 1000 is improved by including the MOSFET 100 with an improved characteristic.

In the first to sixth embodiments, a case of a crystal structure of 4H—SiC is described as an example. However, the present disclosure can be applied to silicon carbide having a crystal structure of 3C—SiC or 6H—SiC.

Further, in the first to sixth embodiments, a case where a gate insulating layer 16 is provided on a silicon face of silicon carbide or on an m-face is described as an example. However, the present disclosure can be applied to a case where a gate insulating layer 16 is provided on another face, such as an a-face or a (0-33-8) face for example, of silicon carbide.

The present disclosure can also be applied to an n-channel insulated gate bipolar transistor (IGBT).

Further, the present disclosure can also be applied to, instead of a vertical transistor, a horizontal transistor in which a source electrode and a drain electrode are provided on the same face of a silicon carbide layer.

In the second embodiment, description of a case where a termination element is nitrogen is described as an example. However, as long as the termination element is at least one element selected from a group including nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu), an effect similar to an effect of nitrogen (N) can be produced, because the number of dangling bonds is decreased on a surface of a silicon carbide layer 10.

In the seventh to tenth embodiments, a case where a semiconductor device according to the present disclosure is applied to a vehicle or elevator is described as an example. However, the semiconductor device according to the present disclosure can be applied to, for example, a power conditioner of a photovoltaic power generation system, or the like.

Further, in the seventh to tenth embodiments, a case where the semiconductor device according to the first embodiment is applied is described as an example. However, a semiconductor device according to the second to sixth embodiments can be applied, for example.

While certain embodiments have been described, these embodiments have been presented by way of example only, and are not intended to limit the scope of the inventions. Indeed, a semiconductor device, an inverter circuit, a drive, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a gate electrode;
   a gate insulating layer; and
   a silicon carbide layer having a first plane and a second plane facing the first plane, the silicon carbide layer including
   a first silicon carbide region of p-type and
   a second silicon carbide region positioned between the first silicon carbide region and the gate insulating layer, and the second silicon carbide region including at least one oxygen atom bonded to four silicon atoms.

2. The semiconductor device according to claim 1, wherein oxygen concentration in the second silicon carbide region is $1\times10^{17}$ cm$^{-3}$ or more and $1\times10^{23}$ cm$^{-3}$ or less.

3. The semiconductor device according to claim 1, wherein oxygen concentration in the second silicon carbide region is $3\times10^{19}$ cm$^{-3}$ or more.

4. The semiconductor device according to claim 1, wherein density of the at least one oxygen atom bonded to four silicon atoms in the second silicon carbide region is higher than density of at least one oxygen atom bonded to two silicon atoms in the second silicon carbide region.

5. The semiconductor device according to claim 1, wherein density of the at least one oxygen atom bonded to four silicon atoms in the second silicon carbide region is higher than density of at least one oxygen atom bonded to a carbon atom in the second silicon carbide region.

6. The semiconductor device according to claim 1, wherein oxygen concentration at a first position is less than $1\times10^{17}$ cm$^{-3}$, the first position is 20 nm away from an interface between the gate insulating layer and the silicon carbide layer toward the silicon carbide layer.

7. The semiconductor device according to claim 1, wherein the second silicon carbide region is p-type.

8. The semiconductor device according to claim 1, wherein the second silicon carbide region includes aluminum, and oxygen concentration in the second silicon carbide region is higher than aluminum concentration in the second silicon carbide region.

9. The semiconductor device according to claim 1, wherein the silicon carbide layer and the gate insulating layer include at least one element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu), a distance from a second position to an interface between the gate insulating layer and the silicon carbide layer is 5 nm or less, and concentration of the at least one element is maximized in the second position.

10. The semiconductor device according to claim 9, wherein concentration of the at least one element in the second position is $4\times10^{19}$ cm$^{-3}$ or more.

11. The semiconductor device according to claim 1, wherein the silicon carbide layer further including
    a third silicon carbide region of n-type positioned between the second plane and the first silicon carbide region,
    a fourth silicon carbide region of n-type positioned between the first silicon carbide region and the first plane and having n-type impurity concentration higher than n-type impurity concentration in the third silicon carbide region, and
    a fifth silicon carbide region positioned between the third silicon carbide region and the gate insulating layer, and the fifth silicon carbide region including at least one oxygen atom bonded to four silicon atoms.

12. The semiconductor device according to claim 11, wherein the fifth silicon carbide region is n-type.

13. The semiconductor device according to claim 11,
wherein the silicon carbide layer further including a sixth silicon carbide region positioned between the fourth silicon carbide region and the gate insulating layer, and the sixth silicon carbide region including at least one oxygen atom bonded to four silicon atoms.

14. The semiconductor device according to claim 13, wherein the sixth silicon carbide region is n-type.

15. A semiconductor device comprising:
a gate electrode;
a gate insulating layer; and
a silicon carbide layer having a first plane and a second plane facing the first plane, the silicon carbide layer including
a first silicon carbide region of n-type and
a second silicon carbide region positioned between the first silicon carbide region and the gate insulating layer, and the second silicon carbide region including at least one oxygen atom bonded to four silicon atoms.

16. The semiconductor device according to claim 15,
wherein the silicon carbide layer further including a trench disposed on a side of the first plane, the trench having a first side face, a second side face, and a bottom face between the first side face and the second side face, and
the second silicon carbide region is positioned between the first silicon carbide region and the bottom face.

17. An inverter circuit comprising the semiconductor device according to claim 1.

18. A drive comprising the semiconductor device according to claim 1.

19. A vehicle comprising the semiconductor device according to claim 1.

20. An elevator comprising the semiconductor device according to claim 1.

\* \* \* \* \*